US011355434B2

(12) United States Patent
Song et al.

(10) Patent No.: US 11,355,434 B2
(45) Date of Patent: Jun. 7, 2022

(54) SEMICONDUCTOR DEVICE AND METHOD OF FABRICATING THE SAME

(71) Applicant: SAMSUNG ELECTRONICS CO., LTD., Suwon-si (KR)

(72) Inventors: Hyun-Seung Song, Hwaseong-si (KR); Kwang-Young Lee, Seongnam-si (KR); Jonghyun Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/016,977

(22) Filed: Sep. 10, 2020

(65) Prior Publication Data

US 2021/0272893 A1    Sep. 2, 2021

(30) Foreign Application Priority Data

Mar. 2, 2020    (KR) .................. 10-2020-0026158

(51) Int. Cl.
*H01L 23/528* (2006.01)
*H01L 27/11* (2006.01)
*H01L 21/768* (2006.01)
*H01L 29/78* (2006.01)

(52) U.S. Cl.
CPC ...... *H01L 23/528* (2013.01); *H01L 21/76802* (2013.01); *H01L 21/76834* (2013.01); *H01L 27/1104* (2013.01); *H01L 21/76843* (2013.01); *H01L 29/785* (2013.01)

(58) Field of Classification Search
CPC ............ H01L 23/528; H01L 21/76802; H01L 21/76834; H01L 27/1104; H01L 21/76843; H01L 29/785; H01L 21/76832; H01L 21/76895; H01L 23/485; H01L 23/5283; H01L 23/5286; H01L 23/53295; H01L 23/5222

See application file for complete search history.

(56) References Cited

U.S. PATENT DOCUMENTS

| 7,879,707  | B2 | 2/2011 | Park |
| 8,951,907  | B2 | 2/2015 | Richter et al. |
| 9,006,834  | B2 | 4/2015 | Schultz |
| 9,236,383  | B2 | 1/2016 | Manning |
| 9,754,880  | B2 | 9/2017 | Baek et al. |
| 10,068,770 | B2 | 9/2018 | Lu et al. |

(Continued)

*Primary Examiner* — Karen Kusumakar
(74) *Attorney, Agent, or Firm* — Lee IP Law, PC

(57) ABSTRACT

A semiconductor device includes a first active pattern on a substrate; a first gate electrode crossing the first active pattern; source/drain patterns in an upper portion of the first active pattern and at opposite sides, respectively, of the first gate electrode; a first gate capping pattern on the first gate electrode; an interlayer insulating layer on the source/drain patterns; first and second active contacts penetrating the interlayer insulating layer and being respectively connected to the pair of source/drain patterns; and a first interconnection layer on the first and second active contacts. The first interconnection layer may include a first insulating structure covering a top surface of the second active contact; and a first interconnection line covering a top surface of the first active contact and extending on the first insulating structure, and covering a top surface of the first gate capping pattern between the first and second active contacts.

19 Claims, 29 Drawing Sheets

(56) References Cited

U.S. PATENT DOCUMENTS

| | | |
|---|---|---|
| 10,163,887 B2 | 12/2018 | Lu et al. |
| 10,304,962 B2 | 5/2019 | Akimoto et al. |
| 2018/0358293 A1* | 12/2018 | Hong ................ H01L 21/32115 |

* cited by examiner

SEMICONDUCTOR DEVICE AND METHOD OF FABRICATING THE SAME

CROSS-REFERENCE TO RELATED APPLICATIONS

Korean Patent Application No. 10-2020-0026158, filed on Mar. 2, 2020, in the Korean Intellectual Property Office, and entitled: "Semiconductor Device and Method of Fabricating the Same," is incorporated by reference herein in its entirety.

BACKGROUND

1. Field

Embodiments relate to a semiconductor device and a method of fabricating the same.

2. Description of the Related Art

Due to their small-sized, multifunctional, and/or low-cost characteristics, semiconductor devices are important elements in the electronic industry. The semiconductor devices may include a memory device for storing data, a logic device for processing data, and a hybrid device including both of memory and logic elements. High reliability, high performance, and/or multiple functions may provide electronic devices with fast speed and/or low power consumption. As such, complexity and/or integration density of semiconductor devices are being increased.

SUMMARY

Embodiments are directed to a semiconductor device, including a first active pattern on a substrate; a first gate electrode crossing the first active pattern; a pair of source/drain patterns provided in an upper portion of the first active pattern and at opposite sides, respectively, of the first gate electrode; a first gate capping pattern on the first gate electrode; an interlayer insulating layer on the pair of source/drain patterns; first and second active contacts that penetrate the interlayer insulating layer and are respectively connected to the pair of source/drain patterns; and a first interconnection layer on the first and second active contacts. The first interconnection layer may include: a first insulating structure covering a top surface of the second active contact; and a first interconnection line covering a top surface of the first active contact and extending on the first insulating structure, and covering a top surface of the first gate capping pattern between the first and second active contacts.

Embodiments are also directed to a semiconductor device, including an active pattern on a substrate; a first gate electrode crossing the active pattern; a pair of source/drain patterns provided in an upper portion of the active pattern and at opposite sides, respectively, of the first gate electrode; a first gate capping pattern on the first gate electrode; an interlayer insulating layer on the pair of source/drain patterns; first and second active contacts that penetrate the interlayer insulating layer and are respectively connected to the pair of source/drain patterns, an upper portion of the first active contact protruding above a top surface of the first gate capping pattern; and a first interconnection layer on the first and second active contacts, the first interconnection layer including: an insulating structure covering a top surface of the second active contact; and an interconnection line covering a top surface of the first active contact and extending on the insulating structure, and covering a side surface of the upper portion of the first active contact.

Embodiments are also directed to a method of fabricating a semiconductor device, including patterning a substrate to form an active pattern; forming a gate electrode that crosses the active pattern; forming a pair of source/drain patterns in an upper portion of the active pattern, the pair of source/drain patterns being formed at opposite sides, respectively, of the gate electrode; forming a gate capping pattern on the gate electrode; forming a first interlayer insulating layer on the pair of source/drain patterns; forming first and second active contacts that penetrate the first interlayer insulating layer and connect to the pair of source/drain patterns, respectively; forming an insulating structure that covers a top surface of the second active contact; and forming an interconnection line on the first active contact, the gate capping pattern, and the insulating structure, the interconnection line being is in contact with a top surface of the first active contact and a top surface of the gate capping pattern.

BRIEF DESCRIPTION OF THE DRAWINGS

Features will become apparent to those of skill in the art by describing in detail example embodiments with reference to the attached drawings in which.

DETAILED DESCRIPTION

Figure 1:
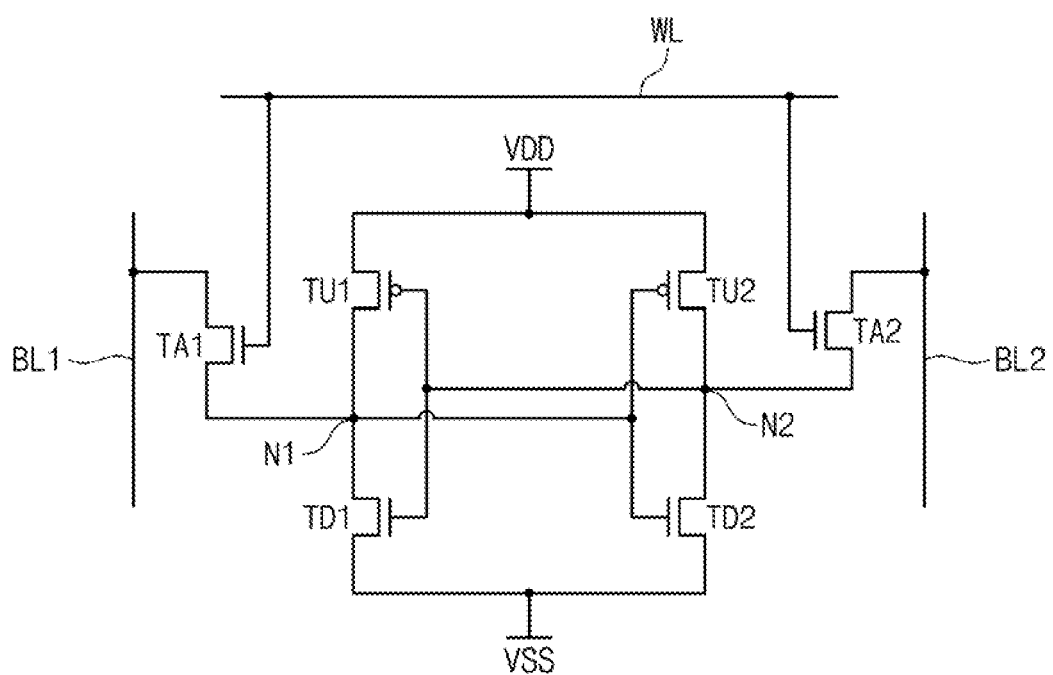
FIG. 1 is an equivalent circuit diagram illustrating an SRAM cell according to an example embodiment.

FIG. 1 is an equivalent circuit diagram illustrating an SRAM cell according to an example embodiment.

Referring to FIG. 1, an SRAM cell according to an example embodiment may include a first pull-up transistor TU1, a first pull-down transistor TD1, a second pull-up transistor TU2, a second pull-down transistor TD2, a first access transistor TA1, and a second access transistor TA2. The first and second pull-up transistors TU1 and TU2 may be p-type metal-oxide-semiconductor (PMOS) transistors. The first and second pull-down transistors TD1 and TD2 and the first and second access transistors TA1 and TA2 may be n-type metal-oxide-semiconductor (NMOS) transistors.

A first source/drain electrode of the first pull-up transistor TU1 (i.e., the source or drain of the first pull-up transistor TU1) and a first source/drain electrode of the first pull-down transistor TD1 may be connected to a first node N1. A second source/drain electrode of the first pull-up transistor TU1 (i.e., other of the source or drain of the first pull-up transistor TU1) may be connected to a power line VDD, and a second source/drain electrode of the first pull-down transistor TD1 may be connected to a ground line VSS. A gate electrode of the first pull-up transistor TU1 and a gate electrode of the first pull-down transistor TD1 may be electrically connected to each other. The first pull-up transistor TU1 and the first pull-down transistor TD1 may constitute a first inverter. The connected gate electrodes of the first pull-up and first pull-down transistors TU1 and TD1 may correspond to an input terminal of the first inverter, and the first node N1 may correspond to an output terminal of the first inverter.

A first source/drain electrode of the second pull-up transistor TU2 and a first source/drain electrode of the second pull-down transistor TD2 may be connected to a second node N2. A second source/drain electrode of the second pull-up transistor TU2 may be connected to the power line VDD, and a second source/drain electrode of the second pull-down transistor TD2 may be connected to the ground line VSS. A gate electrode of the second pull-up transistor TU2 and a gate electrode of the second pull-down transistor TD2 may be electrically connected to each other. Accordingly, the second pull-up transistor TU2 and the second pull-down transistor TD2 may constitute a second inverter. The connected gate electrodes of the second pull-up and second pull-down transistors TU2 and TD2 may correspond to an input terminal of the second inverter, and the second node N2 may correspond to an output terminal of the second inverter.

The first and second inverters may be coupled with each other to form a latch structure. Thus, the gate electrodes of the first pull-up and first pull-down transistors TU1 and TD1 may be electrically connected to the second node N2, and the gate electrodes of the second pull-up and second pull-down transistors TU2 and TD2 may be electrically connected to the first node N1. A first source/drain electrode of the first access transistor TA1 may be connected to the first node N1, and a second source/drain electrode of the first access transistor TA1 may be connected to a first bit line BL1. A first source/drain electrode of the second access transistor TA2 may be connected to the second node N2, and a second source/drain electrode of the second access transistor TA2 may be connected to a second bit line BL2. Gate electrodes of the first and second access transistors TA1 and TA2 may be electrically coupled to a word line WL. This structure is just an example of the SRAM cell according to an example embodiment.

Figure 2:
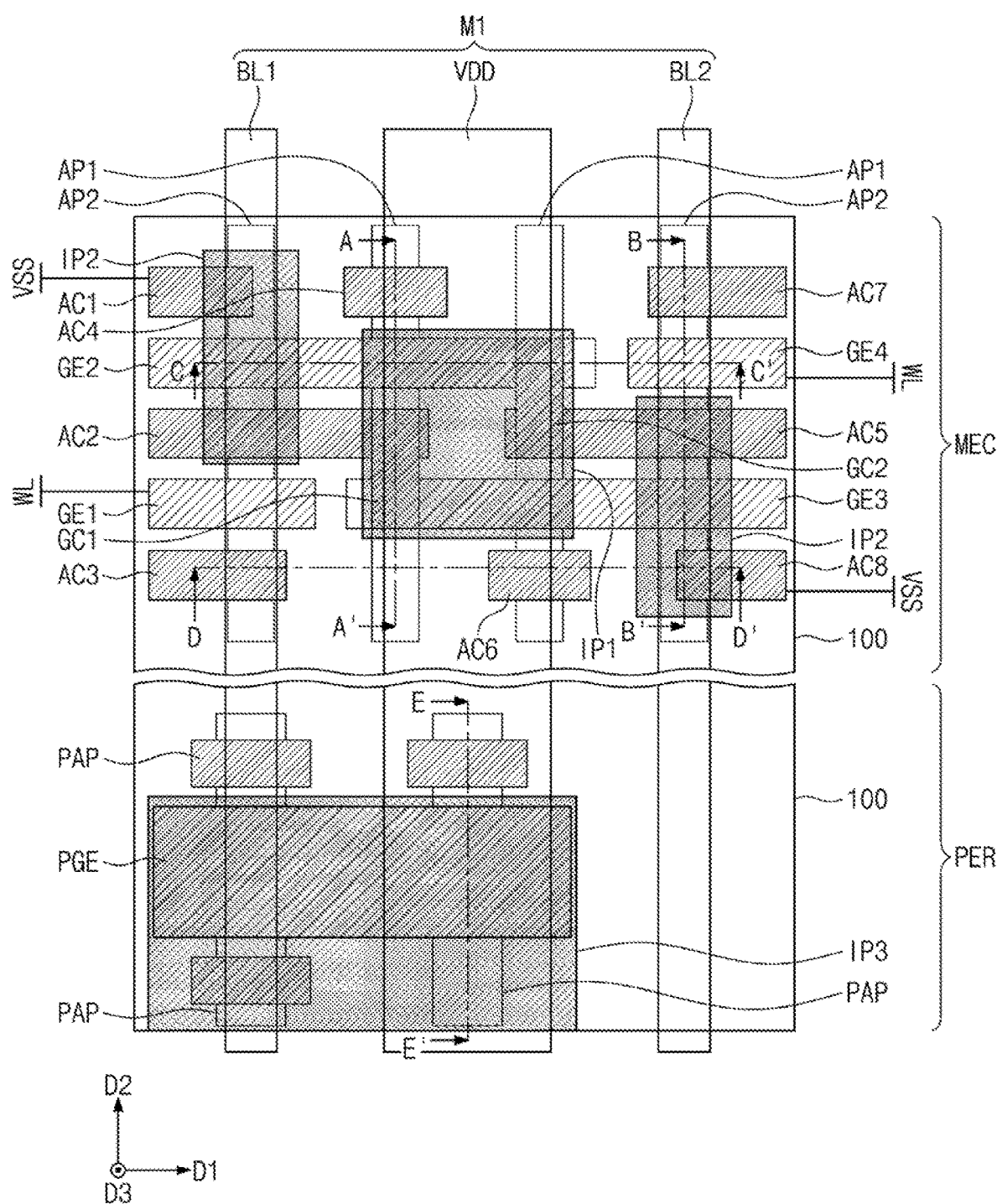
FIG. 2 is a plan view illustrating a semiconductor device according to an example embodiment.
Figure 3A:
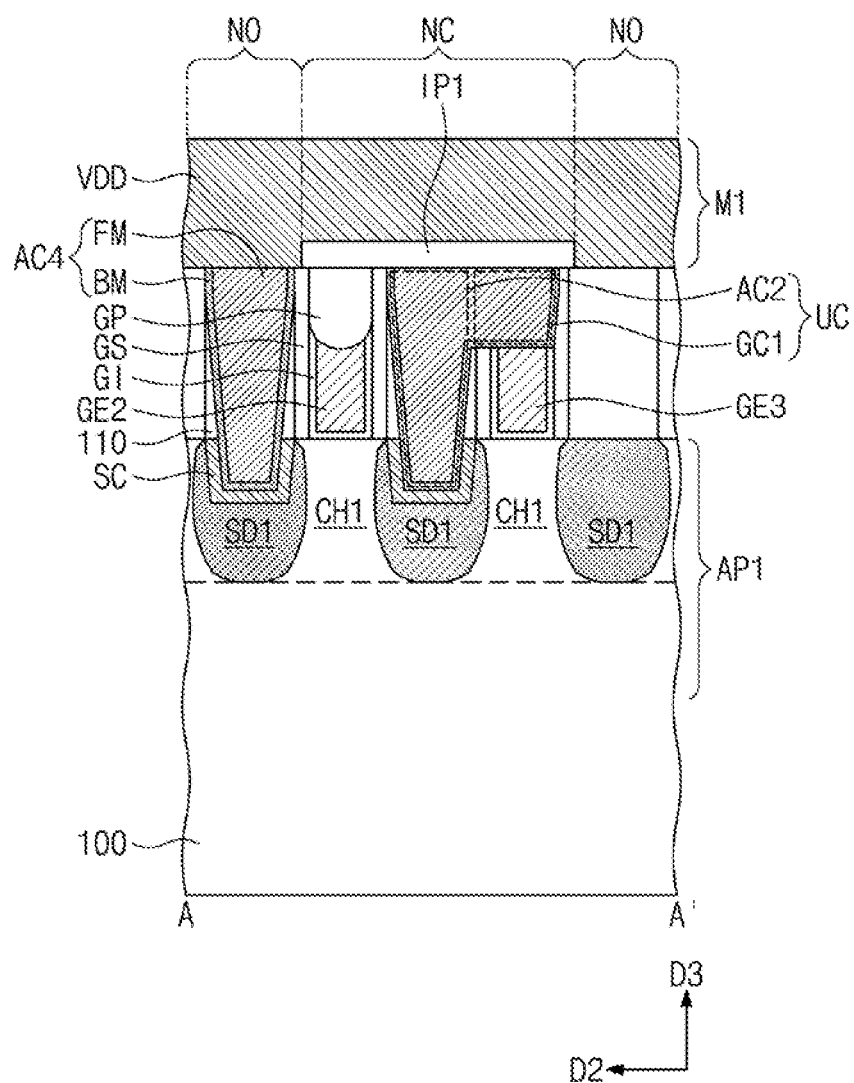
FIGS. 3A to 3E are sectional views taken along lines A-A', B-B', C-C', D-D', and E-E', respectively, of FIG. 2.
Figure 3B:
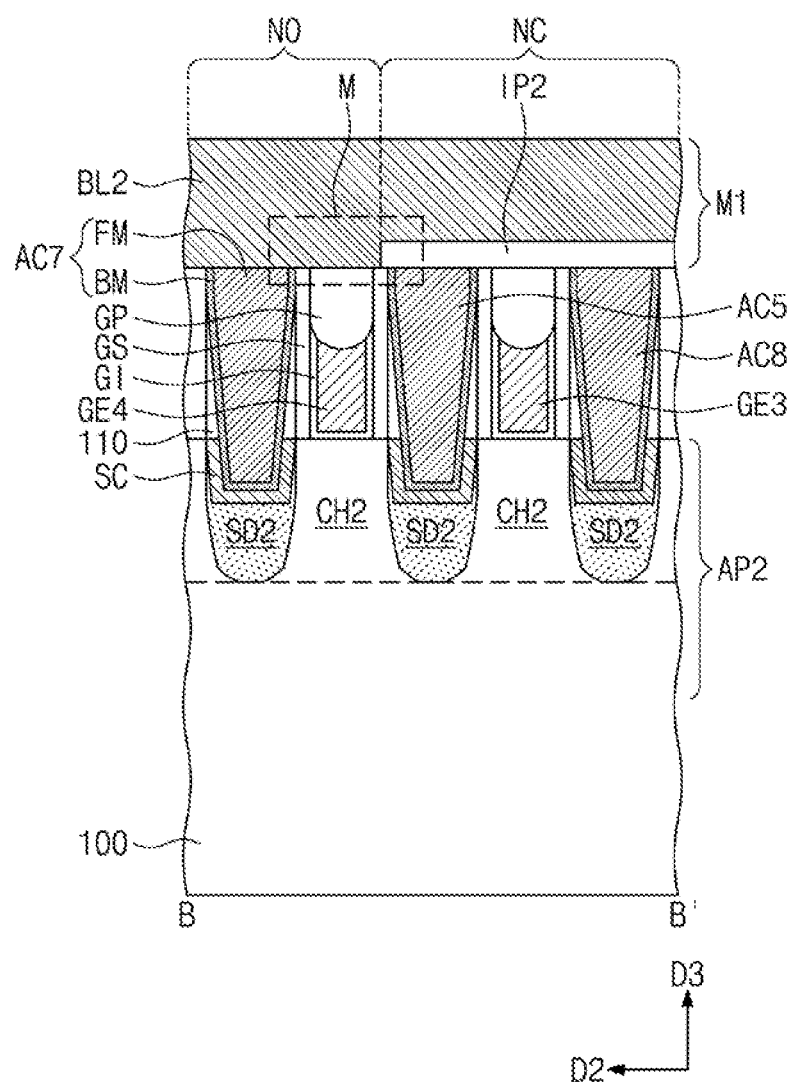

FIG. 2 is a plan view illustrating a semiconductor device according to an example embodiment. FIGS. 3A to 3E are sectional views taken along lines A-A', B-B', C-C', D-D' and E-E', respectively, of FIG. 2. FIG. 4 is an enlarged sectional view of a portion 'M' of FIG. 3B. For example, FIG. 2 is a plan view illustrating an example of an SRAM cell, which is configured to have the circuit structure shown in FIG. 1.

Referring to FIG. 2, a substrate 100 having at least one memory cell region MEC (e.g., an SRAM cell) may be provided. The substrate 100 may further have a peripheral region PER. The peripheral region PER may be a region on which transistors, e.g., constituting a processor core or I/O terminals, are disposed. The transistor in the peripheral region PER may be operated with higher power than a transistor in the memory cell region MEC. Hereinafter, the memory cell region MEC will be described in more detail with reference to FIGS. 1, 2, 3A to 3D, and 4.

A device isolation layer ST may be provided on the substrate 100. The device isolation layer ST may define first and second active patterns AP1 and AP2. The substrate 100 may be a semiconductor substrate (e.g., of silicon, germanium, or silicon-germanium) or a compound semiconductor substrate. The device isolation layer ST may be formed of or include an insulating material (e.g., silicon oxide).

The first and second active patterns AP1 and AP2 may be portions of the substrate 100. A trench TR may be defined between the first and second active patterns AP1 and AP2, which are adjacent to each other. The device isolation layer ST may fill the trench TR. The first and second active patterns AP1 and AP2 may have upper portions protruding vertically above the device isolation layer ST. Each of the upper portions of the first and second active patterns AP1 and AP2 may be a fin-shaped structure vertically protruding above the device isolation layer ST. Thus, each of the first and second active patterns AP1 and AP2 may be an active fin.

First channel patterns CH1 and first source/drain patterns SD1 may be provided in the upper portion of each of the first active patterns AP1. Second channel patterns CH2 and second source/drain patterns SD2 may be provided in the upper portion of each of the second active patterns AP2. The first source/drain patterns SD1 may be p-type impurity regions. The second source/drain patterns SD2 may be n-type impurity regions. Each of the first channel patterns CH1 may be interposed between the pair of first source/drain patterns SD1, and each of the second channel patterns CH2 may be interposed between the pair of second source/drain patterns SD2.

The first and second source/drain patterns SD1 and SD2 may be epitaxial patterns, which are formed by a selective epitaxial growth process. In an example embodiment, the first and second source/drain patterns SD1 and SD2 may have top surfaces that are located at substantially the same level as top surfaces of the first and second channel patterns CH1 and CH2. In another example embodiment, the top surfaces of the first and second source/drain patterns SD1 and SD2 may be located at a level higher than the top surfaces of the first and second channel patterns CH1 and CH2.

The first and second source/drain patterns SD1 and SD2 may contain a semiconductor element that is the same as or different from that of the substrate 100. In an example embodiment, the first source/drain patterns SD1 may be formed of or include a semiconductor material whose lattice constant is greater than that of the substrate 100. In this case, the first source/drain patterns SD1 may exert a compressive stress on the first channel patterns CH1. In an example embodiment, the first source/drain patterns SD1 may be formed of or include silicon-germanium (SiGe). The second source/drain patterns SD2 may be formed of or include the same semiconductor material as the substrate 100. For example, the second source/drain patterns SD2 may be formed of or include silicon (Si).

First to fourth gate electrodes GE1 to GE4, which are extended in a first direction D1, may be provided to cross the first and second active patterns AP1 and AP2. The first to fourth gate electrodes GE1 to GE4 may be overlapped with the first and second channel patterns CH1 and CH2, when viewed in a plan view. In an example embodiment, the first to fourth gate electrodes GE1 to GE4 may be formed of or include at least one of conductive metal nitrides (e.g., titanium nitride or tantalum nitride) or metals (e.g., titanium, tantalum, tungsten, copper, or aluminum).

Figure 3C:
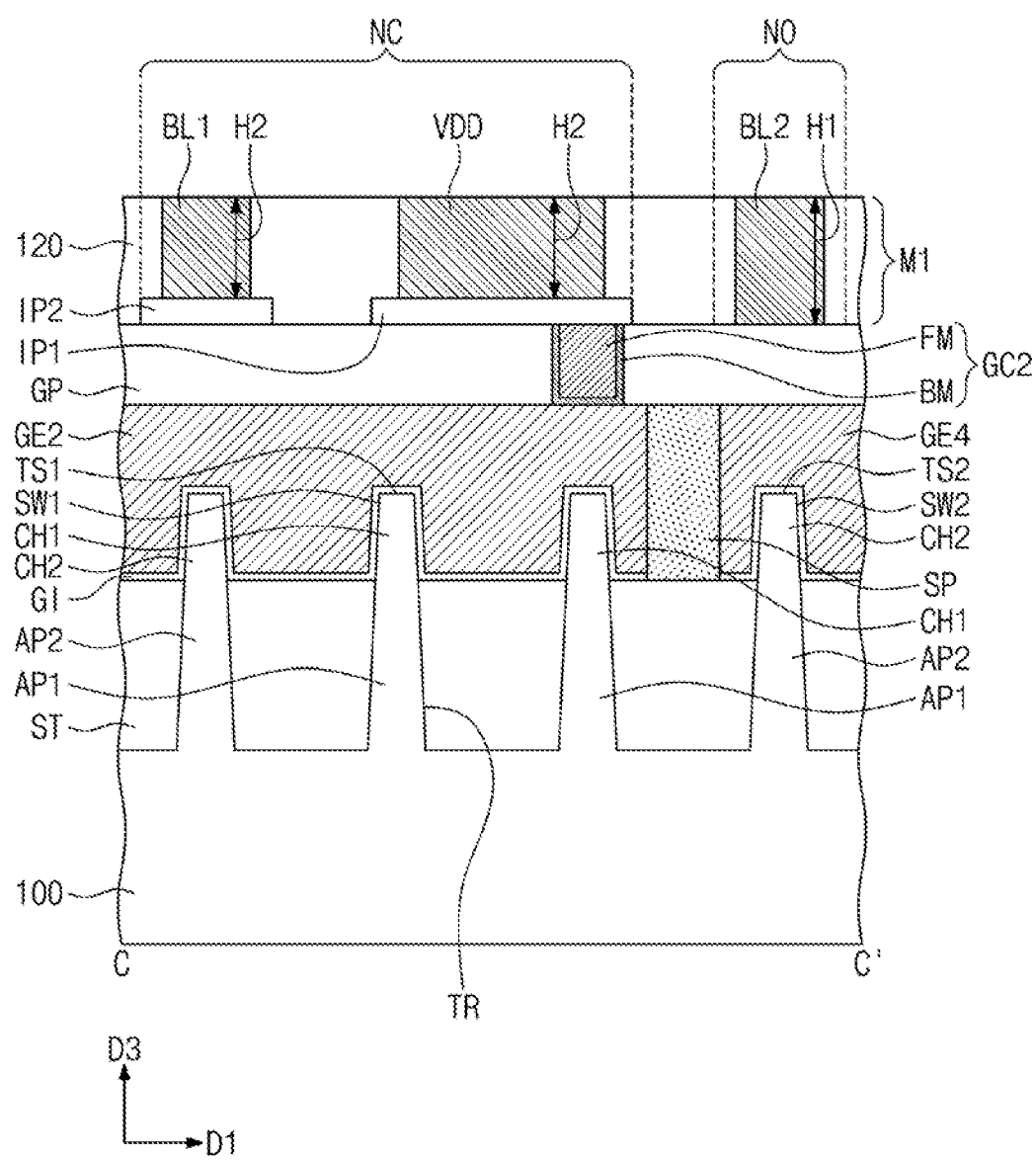
Figure 4:
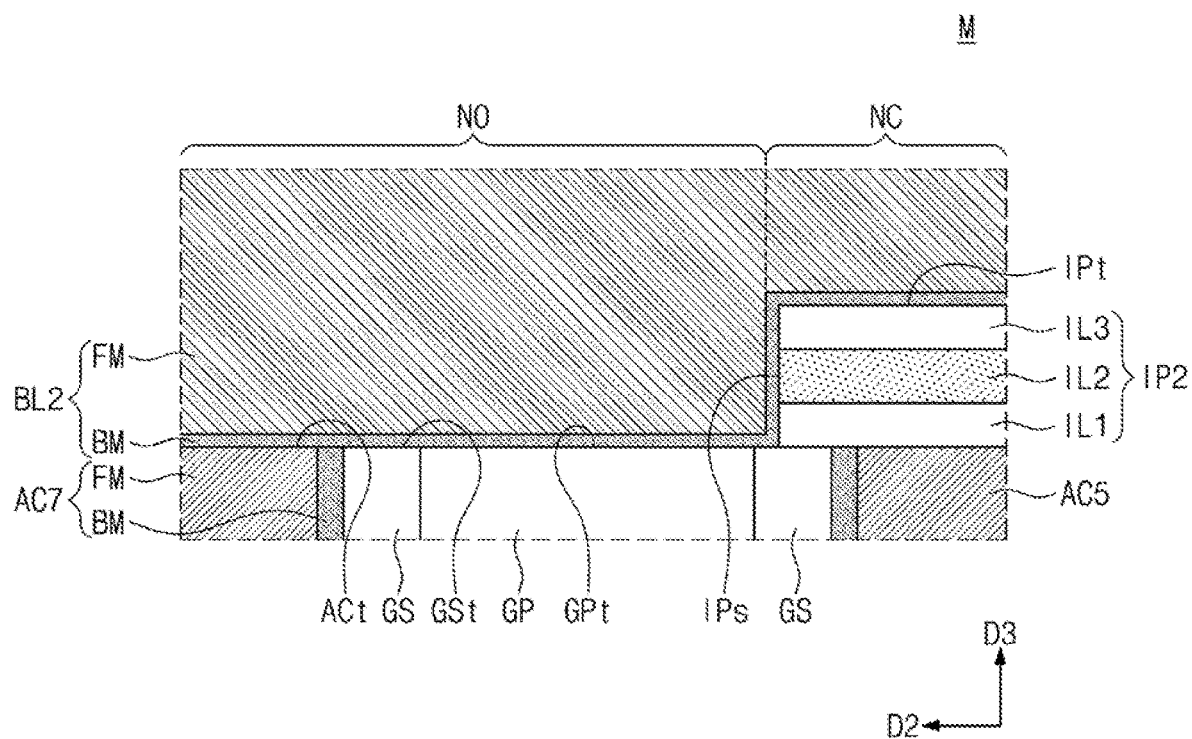
FIG. 4 is an enlarged sectional view of a portion 'M' of FIG. 3B.

Referring to FIG. 3C, the second gate electrode GE2 and the fourth gate electrode GE4 may be aligned side by side to each other in the first direction D1. An insulating pattern SP may be interposed between the second gate electrode GE2 and the fourth gate electrode GE4 to separate them from each other.

Similarly, as shown in FIG. 2, the first gate electrode GE1 and the third gate electrode GE3 may be aligned side by side to each other in the first direction D1. The insulating pattern SP may be interposed between the first gate electrode GE1 and the third gate electrode GE3 to separate them from each other.

Referring back to FIG. 3C, the second gate electrode GE2 may be provided on a first top surface TS1 of the first channel pattern CH1 and at least one first side surface SW1 of the first channel pattern CH1. The fourth gate electrode GE4 may be provided on a second top surface TS2 of the second channel pattern CH2 and at least one second side surface SW2 of the second channel pattern CH2. Thus, the transistor according to the present embodiment may be a three-dimensional field-effect transistor (e.g., FinFET), in which the gate electrode is provided to three-dimensionally surround the channel pattern.

As shown in, e.g., FIG. 3A and described in further detail below, a pair of gate spacers GS may be disposed on opposite side surfaces of each of the first to fourth gate electrodes GE1 to GE4. The gate spacers GS may be extended along the first to fourth gate electrodes GE1 to GE4 and in the first direction D1. Top surfaces of the gate spacers GS may be higher than top surfaces of the first to fourth gate electrodes GE1 to GE4. The top surfaces of the gate spacers GS may be coplanar with a top surface of a first interlayer insulating layer 110, which will be described below. The gate spacers GS may be formed of or include at least one of $SiO_2$, SiCN, SiCON, or SiN. In an example embodiment, the gate spacers GS may include a multi-layered structure that is made of at least two of $SiO_2$, SiCN, SiCON, or SiN.

Gate dielectric patterns GI may be interposed between the first to fourth gate electrodes GE1 to GE4 and the first and second active patterns AP1 and AP2. The gate dielectric patterns GI may be respectively extended along bottom surfaces of the first to fourth gate electrodes GE1 to GE4.

Referring to FIG. 3C, the gate dielectric pattern GI may cover the first top surface TS1 of the first channel pattern CH1 and the at least one first side surface SW1 of the first channel pattern CH1. The gate dielectric pattern GI may cover the second top surface TS2 of the second channel pattern CH2 and the at least one second side surface SW2 of the second channel pattern CH2.

The gate dielectric patterns GI may be formed of or include at least one of high-k dielectric materials. For example, the high-k dielectric materials may be formed of or include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium, tantalum oxide, or lead zinc niobate.

Gate capping patterns GP may be provided on the first to fourth gate electrodes GE1 to GE4, respectively. The gate capping patterns GP may be extended along the first to fourth gate electrodes GE1 to GE4 and in the first direction D1. The gate capping pattern GP may be interposed between the pair of gate spacers GS. The gate capping patterns GP may be formed of or include a material having an etch selectivity with respect to first and second interlayer insulating layers 110 and 120. For example, the gate capping patterns GP may be formed of or include at least one of SiON, SiCN, SiCON, or SiN.

The first interlayer insulating layer 110 may be provided on the substrate 100. The first interlayer insulating layer 110 may cover the gate spacers GS, e.g., at the sides thereof, and the first and second source/drain patterns SD1 and SD2. A top surface of the first interlayer insulating layer 110 may be substantially coplanar with the top surfaces of the gate capping patterns GP and the top surfaces of the gate spacers GS.

First to eighth active contacts AC1 to AC8 may be provided. The first to eighth active contacts AC1 to AC8 may be provided to penetrate the first interlayer insulating layer 110 and may be coupled to the first and second source/drain patterns SD1 and SD2. As shown in, e.g., FIG. 3D, the first to eighth active contacts AC1 to AC8 may have top surfaces that are coplanar with the top surface of the first interlayer insulating layer 110.

Each of the first to eighth active contacts AC1 to AC8 may be a self-aligned contact. For example, the active contacts AC1 to AC8 may be formed in a self-aligned manner by the gate capping pattern GP and the gate spacer GS. For example, the active contacts AC1 to AC8 may cover at least a portion of a side surface of the gate spacer GS.

Silicide patterns SC may be interposed between the first to eighth active contacts AC1 to AC8 and the first and second source/drain patterns SD1 and SD2. The active contacts AC1 to AC8 may be electrically connected to the source/drain patterns SD1 and SD2 through the silicide patterns SC. The silicide patterns SC may be formed of or include at least one of metal-silicides (e.g., titanium silicide, tantalum silicide, tungsten silicide, nickel silicide, and cobalt silicide).

A first gate contact GC1 may be provided on the third gate electrode GE3, and a second gate contact GC2 may be provided on the second gate electrode GE2. The first gate contact GC1 may be provided to penetrate the first interlayer insulating layer 110, the gate spacers GS, and the gate capping pattern GP, and may be coupled to the third gate electrode GE3. The second gate contact GC2 may be provided to penetrate the first interlayer insulating layer 110, the gate spacers GS, and the gate capping pattern GP, and may be coupled to the second gate electrode GE2.

The first and second gate contacts GC1 and GC2 may have top surfaces that are coplanar with the top surface of the first interlayer insulating layer 110. A bottom surface of each of the first and second gate contacts GC1 and GC2 may be located at a level higher than bottom surfaces of the first to eighth active contacts AC1 to AC8.

Referring to FIG. 3A, the first gate contact GC1 and the second active contact AC2 may be connected to each other to constitute a single object (hereinafter, a contact structure UC). The third gate electrode GE3 may be directly connected to the first source/drain pattern SD1, which is located adjacent to the same, through the contact structure UC. The second gate contact GC2 and the fifth active contact AC5 may also be connected to each other to constitute a single contact structure.

Each of the active contacts AC1 to AC8 and the gate contacts GC1 and GC2 may include a conductive pattern FM and a barrier pattern BM enclosing the conductive pattern FM. The conductive pattern FM may be formed of or include, e.g., at least one metal of aluminum, copper, tungsten, molybdenum, or cobalt. The barrier pattern BM may cover side and bottom surfaces of the conductive pattern FM. The barrier pattern BM may include at least one of a metal layer or a metal nitride layer. The metal layer may be formed of or include at least one of titanium, tantalum, tungsten, nickel, cobalt, or platinum. The metal nitride layer may be formed of or include at least one of titanium nitride (TiN), tantalum nitride (TaN), tungsten nitride (WN), nickel nitride (NiN), cobalt nitride (CoN), or platinum nitride (PtN).

A second interlayer insulating layer 120 may be provided on the first interlayer insulating layer 110. In an example embodiment, the first and second interlayer insulating layers 110 and 120 may be formed of or include silicon oxide.

A first interconnection layer M1 may be provided in the second interlayer insulating layer 120. The first interconnection layer M1 may include the first bit line BL1, the second bit line BL2, and the power line VDD. The first bit line BL1, the second bit line BL2, and the power line VDD may be extended in a second direction D2 and parallel to each other. A line width of the power line VDD may be larger than a line width of each of the first and second bit lines BL1 and BL2.

The first and second bit lines BL1 and BL2 and the power line VDD of the first interconnection layer M1 may be directly provided on the first to eighth active contacts AC1 to AC8 and the first and second gate contacts GC1 and GC2. The interconnection lines BL1, BL2, and VDD of the first interconnection layer M1 may have bottom surfaces that are located at the same level as the bottom surface of the second interlayer insulating layer 120. The contacts AC1 to AC8, GC1, and GC2 may have top surfaces that are located at the same level as the top surface of the first interlayer insulating layer 110. Thus, the interconnection lines BL1, BL2, and VDD of the first interconnection layer M1 may be in direct contact with the contacts AC1 to AC8, GC1, and GC2, which are disposed under the same.

The first interconnection layer M1 may include insulating structures IP1 and IP2, which are provided in a lower portion thereof. For example, a first insulating structure IP1 and a pair of second insulating structures IP2 may be provided on one SRAM cell shown in FIG. 2. The first insulating structure IP1 may be provided under the power line VDD. In an example embodiment, one of the pair of second insulating structures IP2 may be provided under the first bit line BL1, and the other of the pair of second insulating structures IP2 may be provided under the second bit line BL2.

The first interconnection layer M1 may have a node open region NO and a node close region NC. The node open region NO may be a region in which the interconnection lines BL1, BL2, and VDD of the first interconnection layer M1 can be directly connected to the contacts AC1 to AC8, GC1, and GC2 thereunder. The node close region NC may be a region in which the interconnection lines BL1, BL2, and VDD of the first interconnection layer M1 cannot be connected to the contacts AC1 to AC8, GC1, and GC2 placed below them. The node close region NC may be a region in which the interconnection lines BL1, BL2, and VDD are disconnected from the contacts AC1 to AC8, GC1, and GC2 placed below them.

For example, each of the first and second insulating structures IP1 and IP2 may be disposed in the node close region NC. Each of the first and second insulating structures IP1 and IP2 may not be overlapped with the node open region NO. Thus, each of the first and second insulating structures IP1 and IP2 may be separated (or offset) from the node open region NO.

For example, referring to FIGS. 2 and 3A, the first insulating structure IP1 may be disposed in the node close region NC of the first interconnection layer M1. The first insulating structure IP1 may directly cover a top surface of the contact structure UC, which is composed of the first gate contact GC1 and the second active contact AC2. Due to the first insulating structure IP1, the power line VDD may not be in contact with the top surface of the contact structure UC. Thus, due to the first insulating structure IP1, the power line VDD may be disconnected from the contact structure UC.

The first insulating structure IP1 may not be disposed in the node open region NO of the first interconnection layer M1. Thus, the fourth active contact AC4 of the node open region NO may be directly connected to the power line VDD provided thereon. The power line VDD of the node open region NO may be connected to the fourth active contact AC4 thereunder.

As another example, referring to FIGS. 2 and 3B, the second insulating structure IP2 may be disposed in the node close region NC of the first interconnection layer M1. The second insulating structure IP2 may directly cover the top surface of the fifth active contact AC5 and the top surface of the eighth active contact AC8. Due to the second insulating structure IP2, the second bit line BL2 may not be in contact with the top surfaces of the fifth and eighth active contacts AC5 and AC8. Thus, the second bit line BL2 may be disconnected from the fifth and eighth active contacts AC5 and AC8 by the second insulating structure IP2.

The second insulating structure IP2 may not be disposed in the node open region NO of the first interconnection layer M1. Thus, the seventh active contact AC7 of the node open region NO may be directly connected to the second bit line BL2 provided thereon. The second bit line BL2 of the node open region NO may be connected to the seventh active contact AC7 thereunder.

In the node open region NO, the second bit line BL2 may be provided to be in direct contact with not only the top surface of the seventh active contact AC7 but also the top surface of the gate spacer GS and the top surface of the gate capping pattern GP.

As other example, referring to FIGS. 2 and 3C, the first insulating structure IP1 and the second insulating structure IP2 may be disposed in the node close region NC of the first interconnection layer M1. The first insulating structure IP1 may be disposed under the power line VDD, and the second insulating structure IP2 may be disposed under the first bit line BL1. Due to the first insulating structure IP1, the second gate contact GC2 below the power line VDD may not be connected to the power line VDD.

The second interlayer insulating layer 120 may have a first height H1. The first height H1 may be a distance between the bottom and top surfaces of the second interlayer insulating layer 120. In the node open region NO, the second bit line BL2 may have the same height (e.g., the first height H1) as the second interlayer insulating layer 120. In the node close region NC, each of the first bit line BL1 and the power line VDD may have a second height H2. The second height H2 may be smaller than the first height H1. Due to the insulating structures IP1 and IP2, the height of the interconnection line in the node close region NC may be reduced.

A ratio H2/H1 of the second height H2 to the first height H1 may range from 0.7 to 0.9. In an example embodiment, the ratio H2/H1 of the second height H2 to the first height H1 may range from 0.75 to 0.89. For example, the first height H1 may be about 30 nm, and the second height H2 may be about 25 nm.

As a comparative example, in the case where the first interconnection layer M1 further includes a via plug additionally provided below the interconnection line, the first height H1 may have an increased value. In this case, the ratio H2/H1 of the second height H2 to the first height H1 may become smaller than 0.7. By contrast, according to an example embodiment, since the via is omitted from the first interconnection layer M1, the ratio H2/H1 of the second height H2 to the first height H1 may have a relatively large value.

Since the height of the interconnection line in the node close region NC is reduced, parasitic capacitance between adjacent ones of the interconnection lines may be decreased. For example, capacitance between the first bit line BL1 and the power line VDD may decrease as a height of each of them decreases. As a result, the insulating structures IP1 and IP2 may help to improve electric characteristics of the first interconnection layer M1.

Figure 3D:
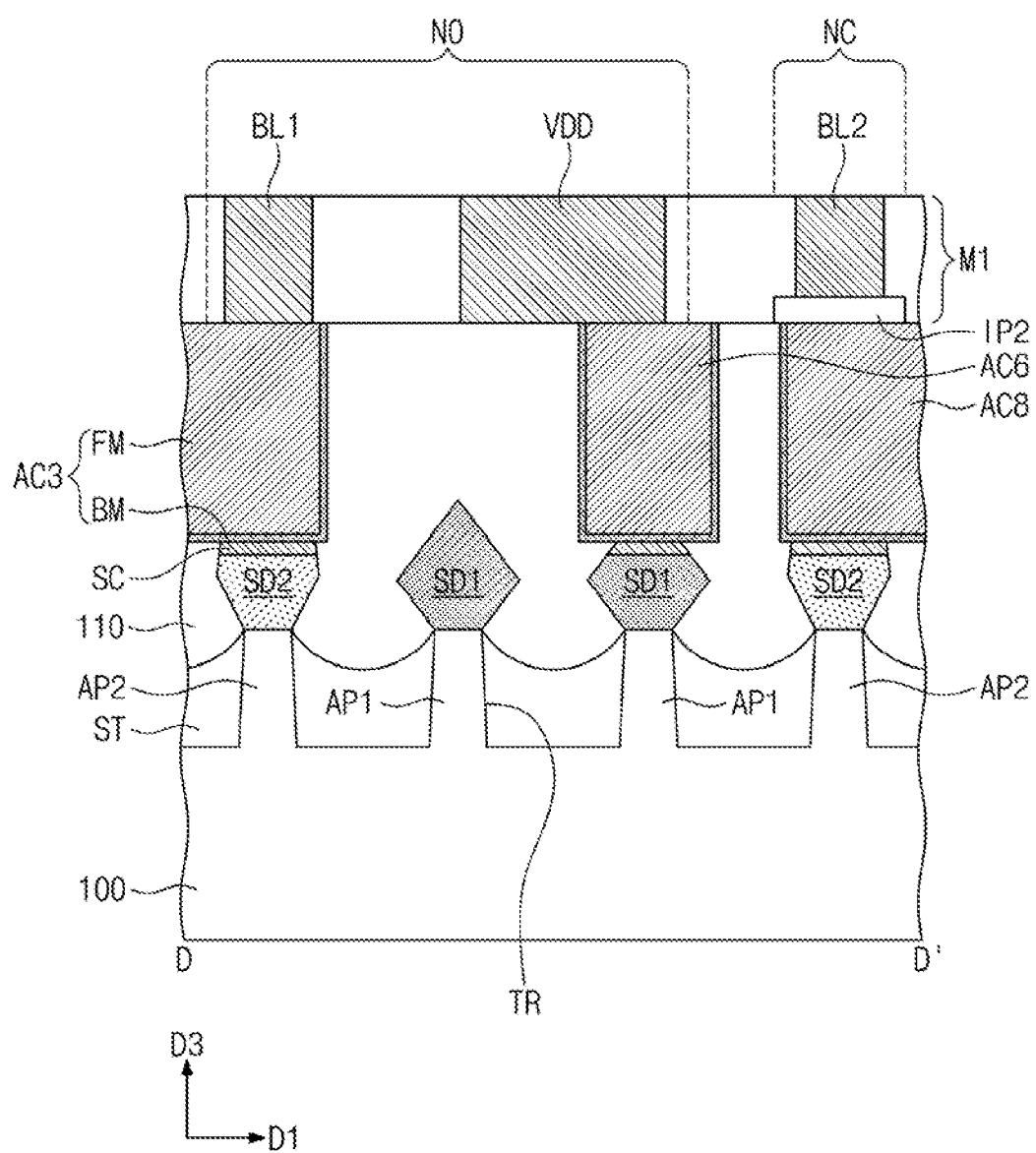

As other example, referring to FIGS. 2 and 3D, the second insulating structure IP2 may be disposed below the second bit line BL2, in the node close region NC of the first interconnection layer M1. Since an insulating structure is not disposed in the node open region NO, the first bit line BL1 and the power line VDD may have bottom surfaces that are located at the same level as the bottom surface of the second interlayer insulating layer 120. Due to the second insulating structure IP2, the eighth active contact AC8 below the second bit line BL2 may not be connected to the second bit line BL2.

In the node open region NO, the third active contact AC3 under the first bit line BL1 may be directly connected to the first bit line BL1, and the sixth active contact AC6 under the power line VDD may be directly connected to the power line VDD. A portion of the bottom surface of the power line VDD may be in contact with the top surface of the sixth active contact AC6, and another portion of the bottom surface of the power line VDD may be in contact with the top surface of the first interlayer insulating layer 110.

Although not shown, at least one interconnection layer including a second interconnection layer may be provided on the first interconnection layer M1. For example, the second interconnection layer may include the ground line VSS and the word line.

The first and second active patterns AP1 and AP2 and the first to fourth gate electrodes GE1 to GE4 described above may constitute the memory transistors. The memory transistors of FIGS. 2 and 3A to 3D may include the first pull-up transistor TU1, the first pull-down transistor TD1, the second pull-up transistor TU2, the second pull-down transistor TD2, the first access transistor TA1, and the second access transistor TA2 previously described with reference to FIG. 1.

According to an example embodiment, the interconnection lines BL1, BL2, and VDD of the first interconnection layer M1 may be directly connected to the contacts AC1 to AC8, GC1, and GC2 therebelow, and thus, connection resistance therebetween may be reduced. Thus, the interconnection lines BL1, BL2, and VDD of the first interconnection layer M1 may be directly connected to the contacts AC1 to AC8, GC1, and GC2, without any via plug. The node close region NC may be defined by disposing the insulating structures IP1 and IP2 in the lower portion of the first interconnection layer M1. This may make it possible to simply realize a desired connection structure between the interconnection lines BL1, BL2, and VDD and the contacts AC1 to AC8, GC1, and GC2. In addition, this may make it possible to effectively reduce parasitic capacitance between adjacent ones of the interconnection lines. Accordingly, according to an example embodiment, it may be possible to improve electric characteristics of a semiconductor device.

In an example embodiment, referring to FIG. 4, the interconnection lines BL1, BL2, and VDD of the first interconnection layer M1 may include the conductive pattern FM and the barrier pattern BM enclosing the conductive pattern FM. The conductive pattern FM may be formed of or include at least one of metallic materials (e.g., copper), and the barrier pattern BM may be formed of or include at least one of metal nitrides (e.g., tantalum nitride (TaN)).

In an example embodiment, the second insulating structure IP2 may include a plurality of stacked insulating layers. For example, the second insulating structure IP2 may include a first insulating layer IL1 a second insulating layer IL2, and a third insulating layer IL3. The first and third insulating layers IL1 and IL3 may be formed of or include silicon oxide, and the second insulating layer IL2 may be formed of or include silicon nitride. In another example embodiment, the second insulating structure IP2 may have only a single insulating layer.

The second bit line BL2 may be extended in the second direction D2 and may be in contact with the second insulating structure IP2, the gate capping pattern GP, the gate spacer GS, and the seventh active contact AC7. The barrier pattern BM of the second bit line BL2 may directly cover a top surface ACt of the seventh active contact AC7, a top surface GSt of the gate spacer GS, a top surface GPt of the gate capping pattern GP, a side surface IPs of the second insulating structure IP2, and a top surface IPt of the second insulating structure IP2.

In the node open region NO, the barrier pattern BM of the second bit line BL2 may be provided to be in direct contact with not only the top surface ACt of the seventh active contact AC7 but also the top surface GSt of the gate spacer GS and the top surface GPt of the gate capping pattern GP.

Figure 3E:
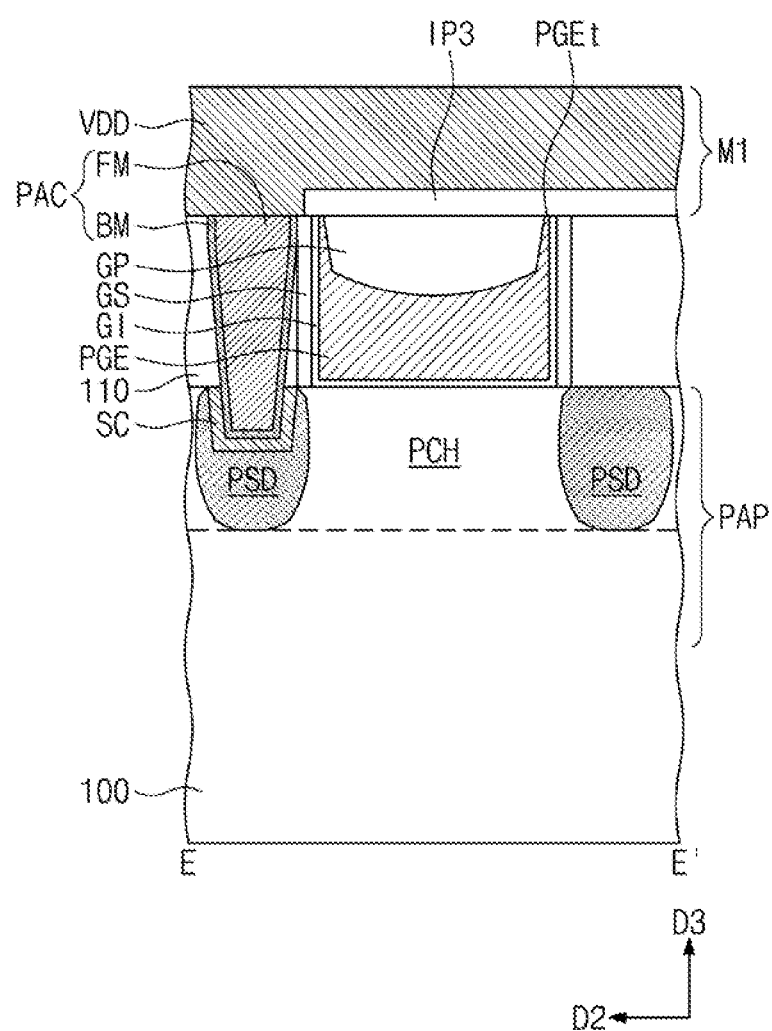

Hereinafter, the peripheral region PER will be described in more detail with reference to FIGS. 2 and 3E. At least one peripheral active pattern PAP may be provided on the substrate 100. The peripheral active pattern PAP may have a larger width than the first and second active patterns AP1 and AP2 of the memory cell region MEC.

A pair of peripheral source/drain patterns PSD and a peripheral channel pattern PCH therebetween may be provided in an upper portion of the peripheral active pattern PAP. The peripheral source/drain patterns PSD may be epitaxial patterns formed by a selective epitaxial growth process. A length of the peripheral channel pattern PCH in the second direction D2 may be longer than the length of each of the first and second channel patterns CH1 and CH2 in the second direction D2, shown in FIGS. 3A and 3B. Thus, the transistor of the peripheral region PER may be a long-channel transistor.

A peripheral gate electrode PGE may be provided to cross the peripheral active pattern PAP and may be extended in the first direction D1. A width of the peripheral gate electrode PGE in the second direction D2 may be larger than the width of each of the first to fourth gate electrodes GE1 to GE4 in the second direction D2, shown in FIGS. 3A and 3B.

The gate capping pattern GP may be provided on the peripheral gate electrode PGE. The gate capping pattern GP may not fully cover an upper portion of the peripheral gate electrode PGE. For example, a topmost end PGEt of the peripheral gate electrode PGE may not be covered with the gate capping pattern GP and may be exposed. The topmost end PGEt of the peripheral gate electrode PGE may be coplanar with the top surface of the gate capping pattern GP. The topmost end PGEt of the peripheral gate electrode PGE may be interposed between the gate capping pattern GP and the gate spacer GS.

Since the peripheral gate electrode PGE has a relatively large width, the topmost end PGEt of the peripheral gate electrode PGE may be exposed by the process of forming the gate capping pattern GP.

A peripheral active contact PAC, which is connected to the at least one peripheral source/drain patterns PSD, may be provided. A top surface of the peripheral active contact PAC may be coplanar with the top surface of the gate capping pattern GP.

The power line VDD of the first interconnection layer M1 may be extended in the second direction D2 to cover the top surface of the peripheral active contact PAC. The peripheral active contact PAC may be directly connected to the power line VDD without additional via plug.

If the exposed topmost end PGEt is in contact with a conductor, e.g., the power line VDD, of the first interconnection layer M1, a process failure (e.g., a short circuit) may occur. According to an example embodiment, a third insulating structure IP3 may be provided on the peripheral gate electrode PGE. The third insulating structure IP3 may cover the top surface of the gate capping pattern GP. The third insulating structure IP3 may not cover the peripheral active contact PAC. Due to the third insulating structure IP3, the topmost end PGEt of the peripheral gate electrode PGE may not be connected to the power line VDD. Thus, due to the third insulating structure IP3 provided on the peripheral gate electrode PGE, it may be possible to prevent a process failure that may occur if the exposed topmost end PGEt of the peripheral gate electrode PGE is in contact with the power line VDD.

Figure 8A:
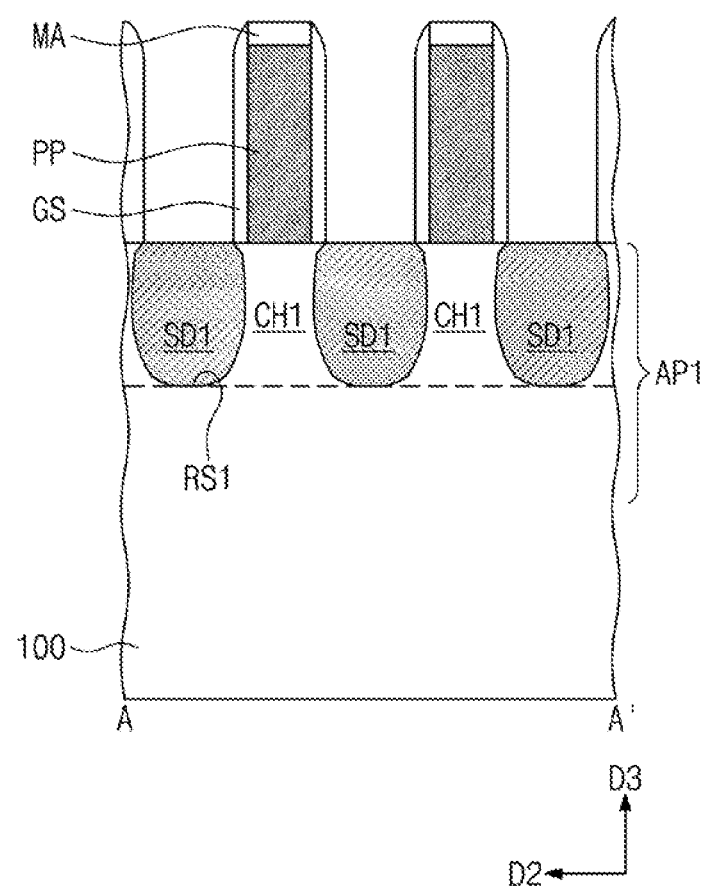
Figure 8B:
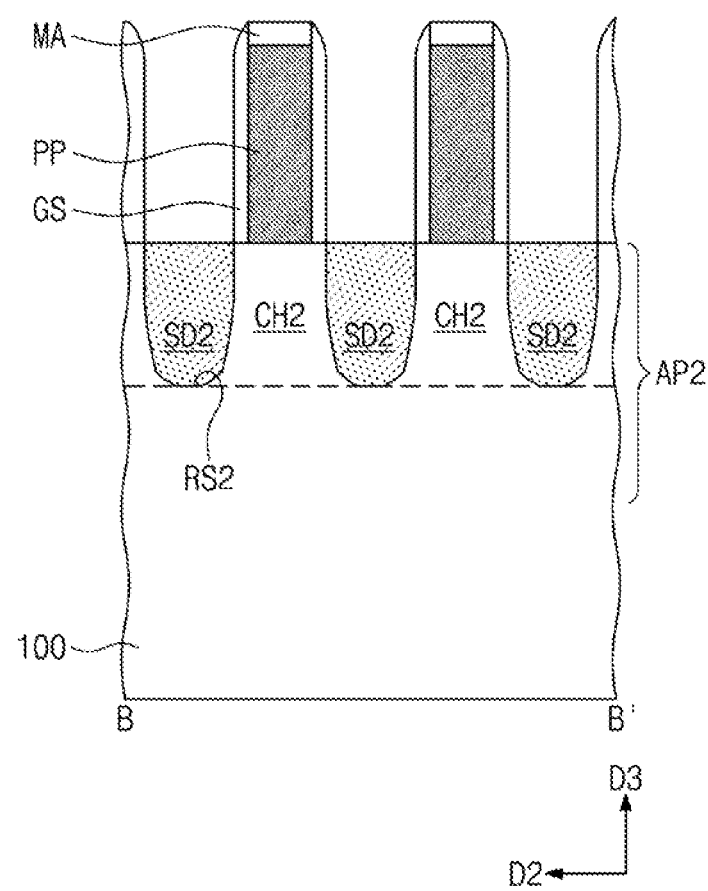
Figure 8C:
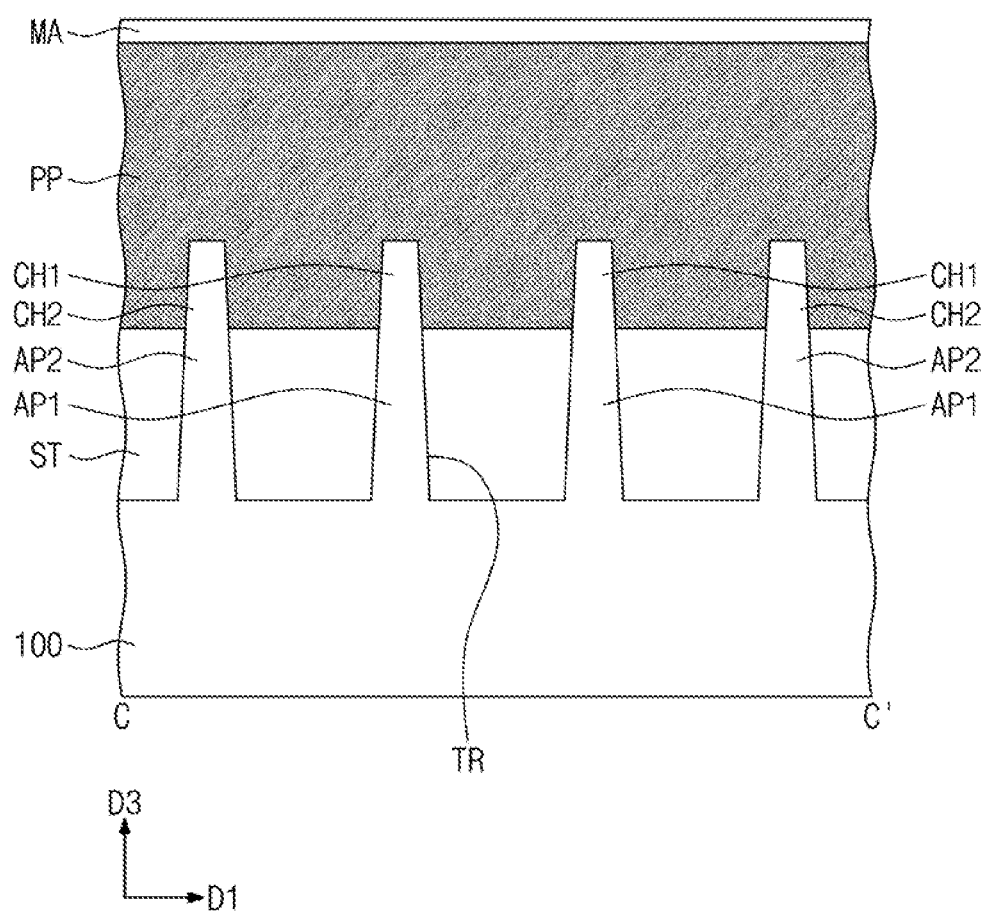
FIGS. 8C, 10C, and 12C are sectional views taken along lines C-C' of FIGS. 7, 9, and 11, respectively.
Figure 8D:
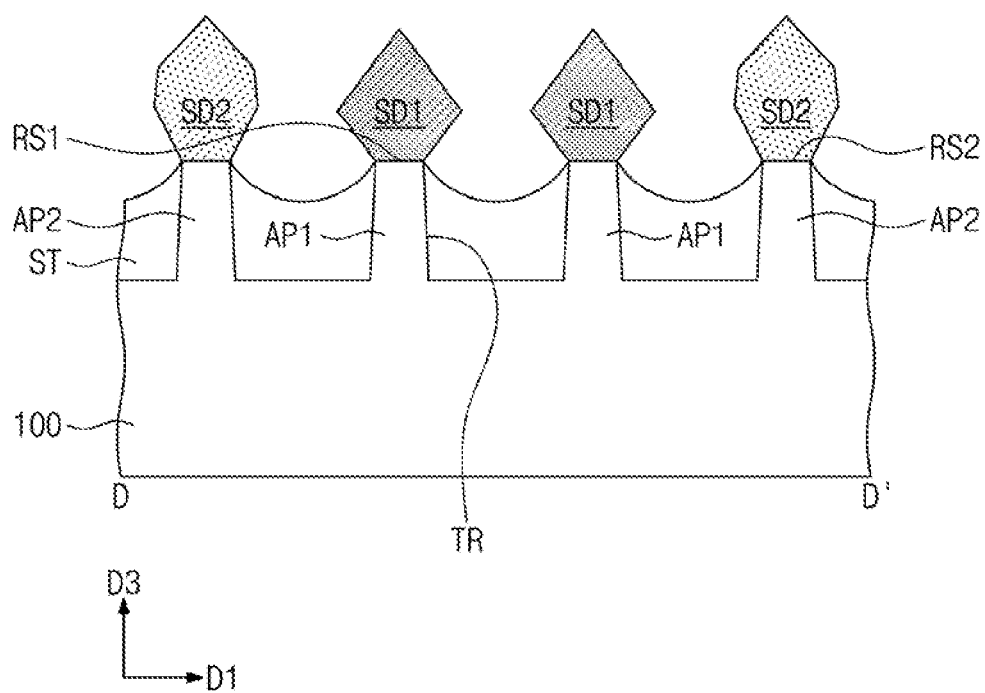
FIGS. 8D, 10D, and 12D are sectional views taken along lines D-D' of FIGS. 7, 9, and 11, respectively.
Figure 9:
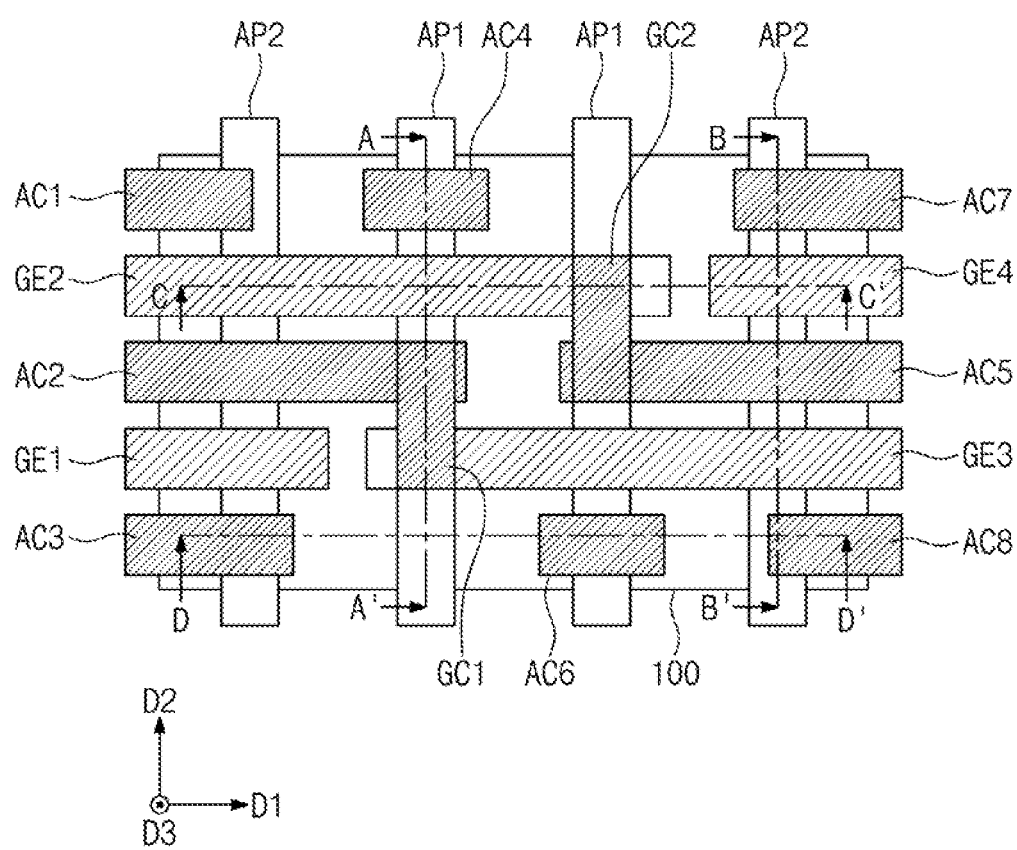
Figure 10A:
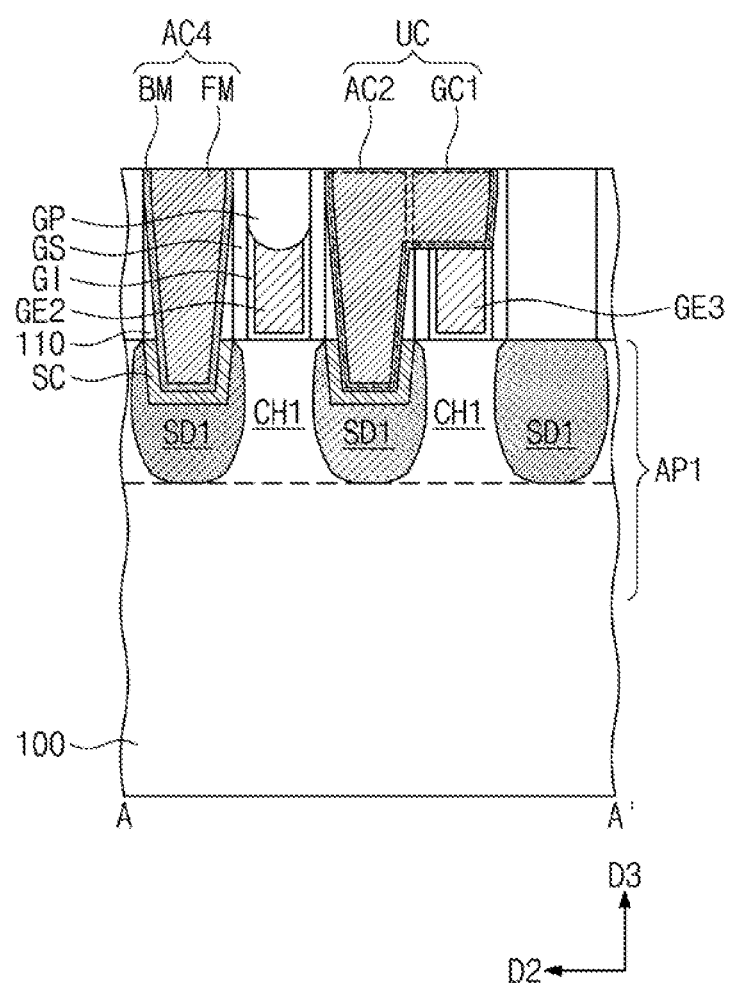
Figure 10B:
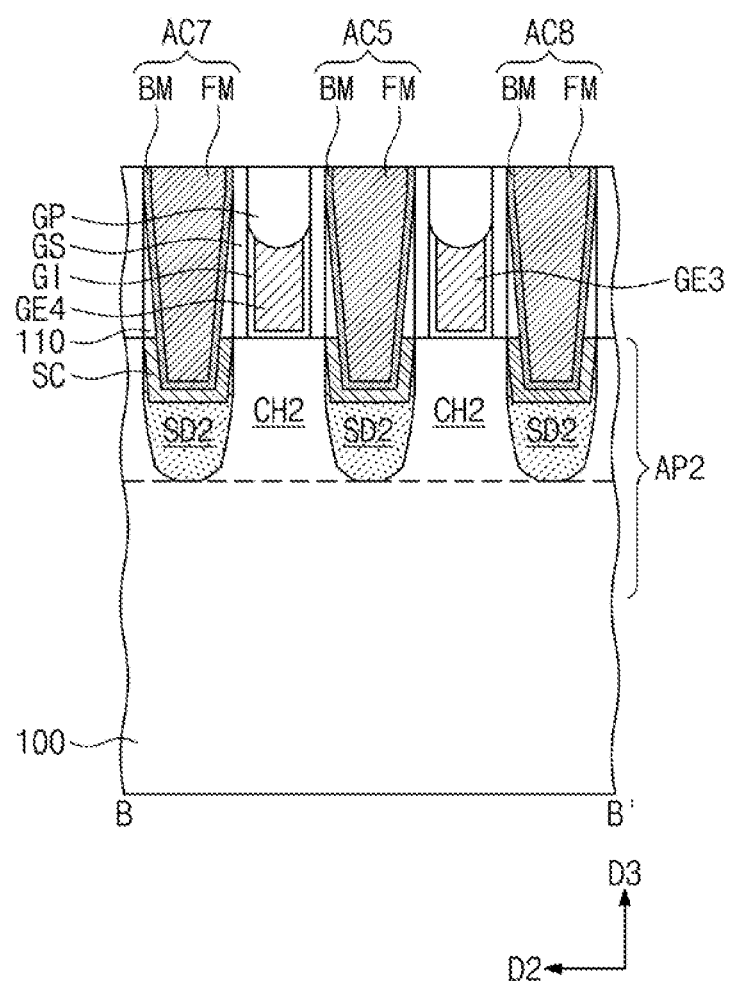
Figure 10C:
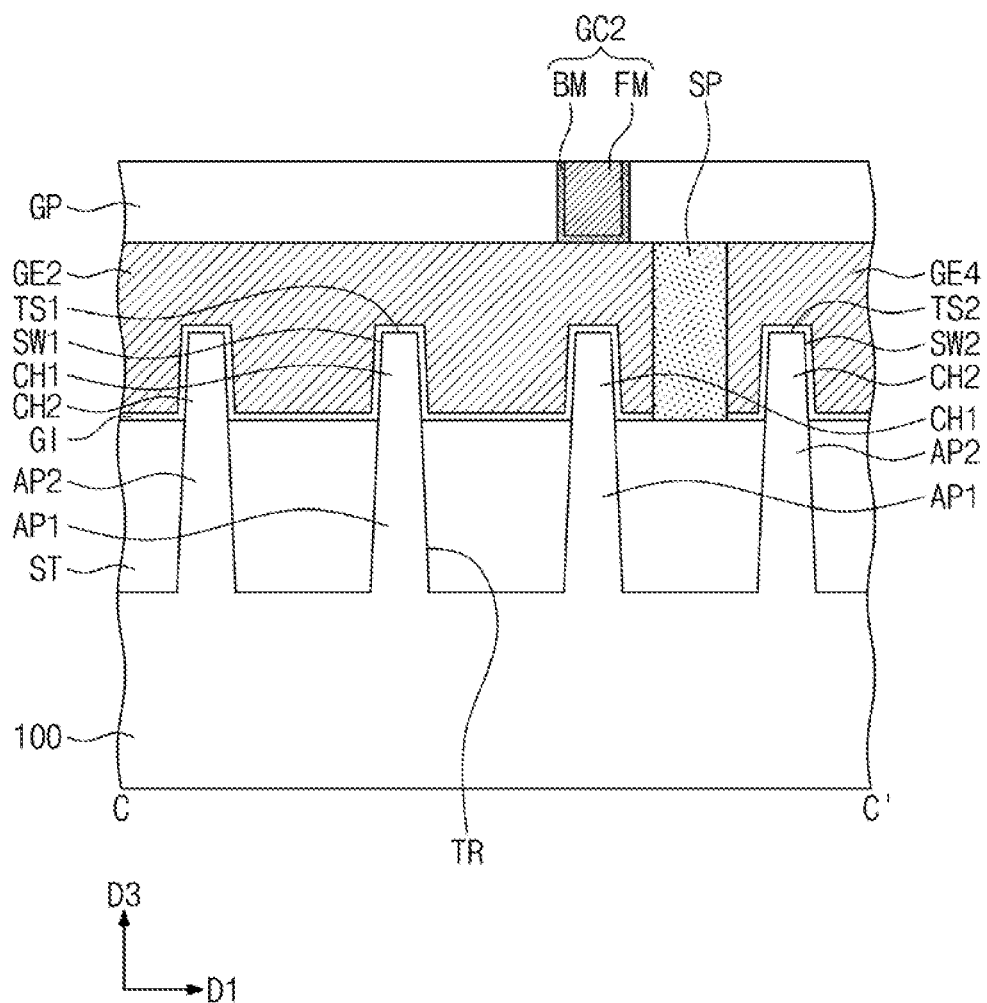
Figure 10D:
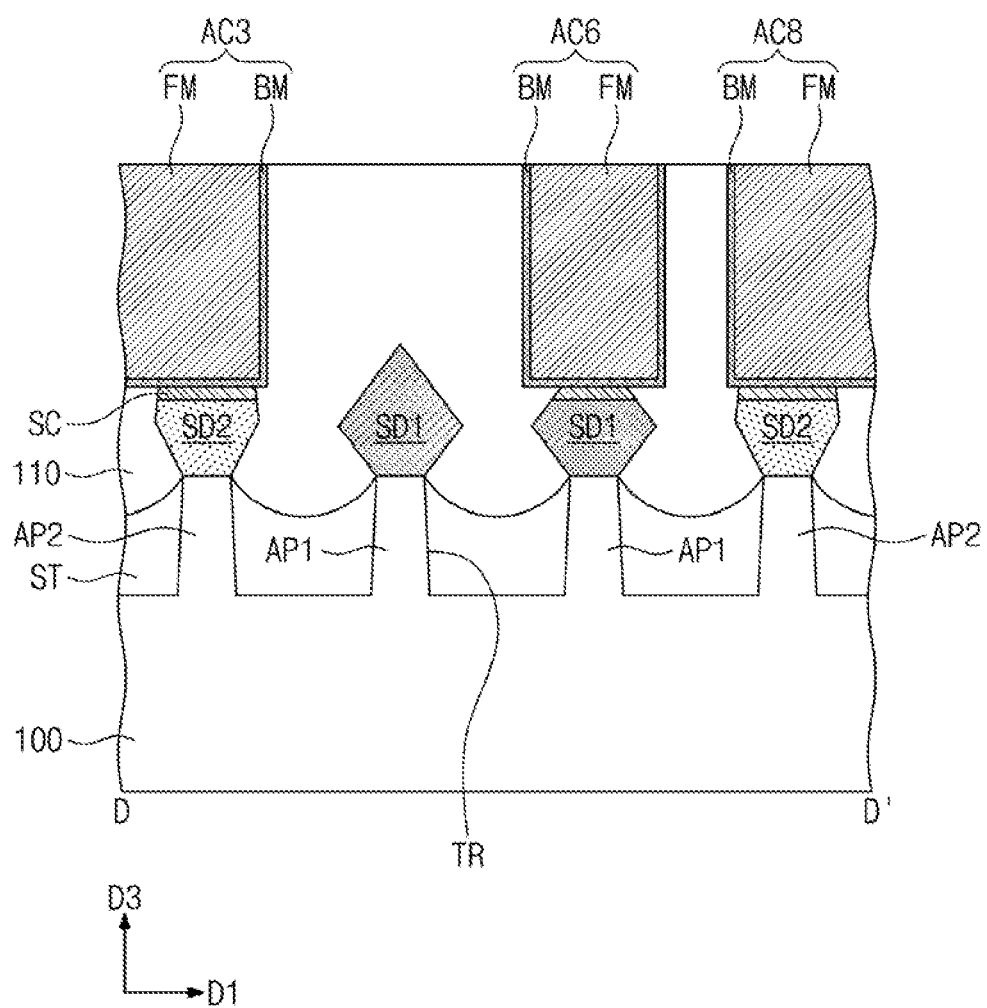
Figure 11:
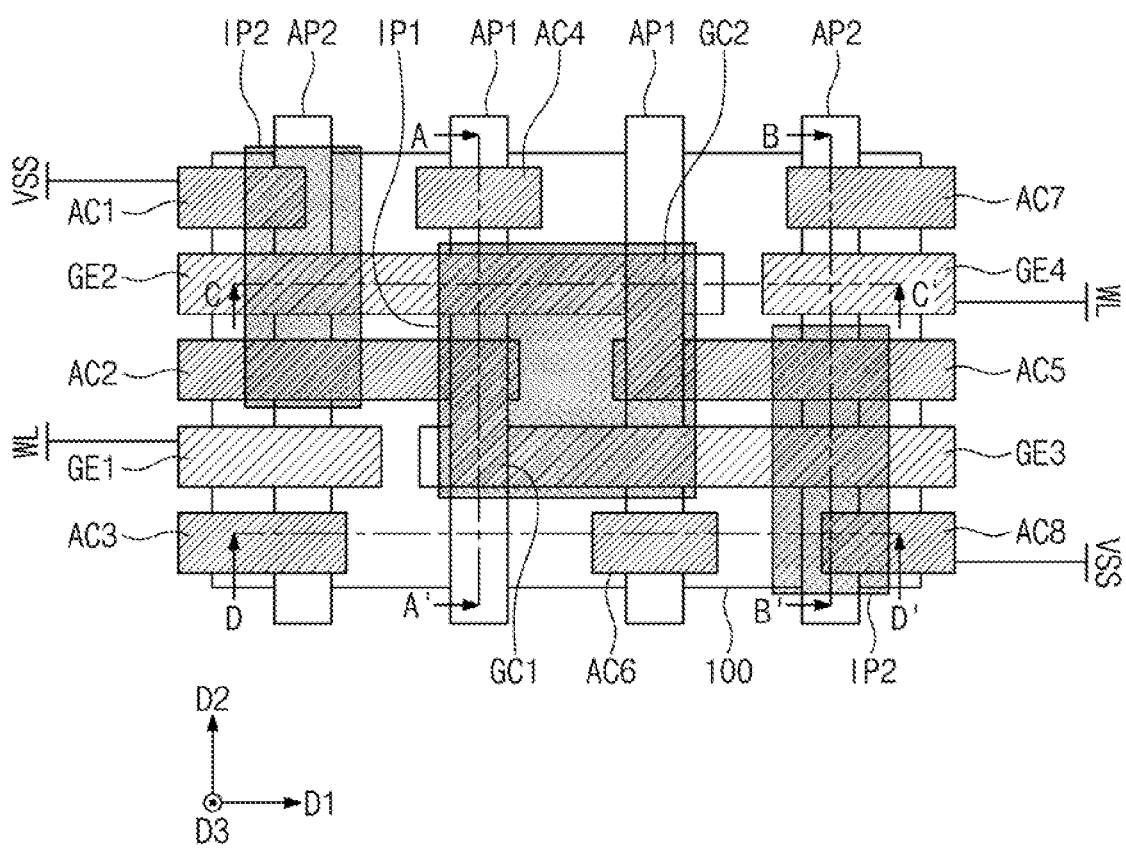
Figure 12A:
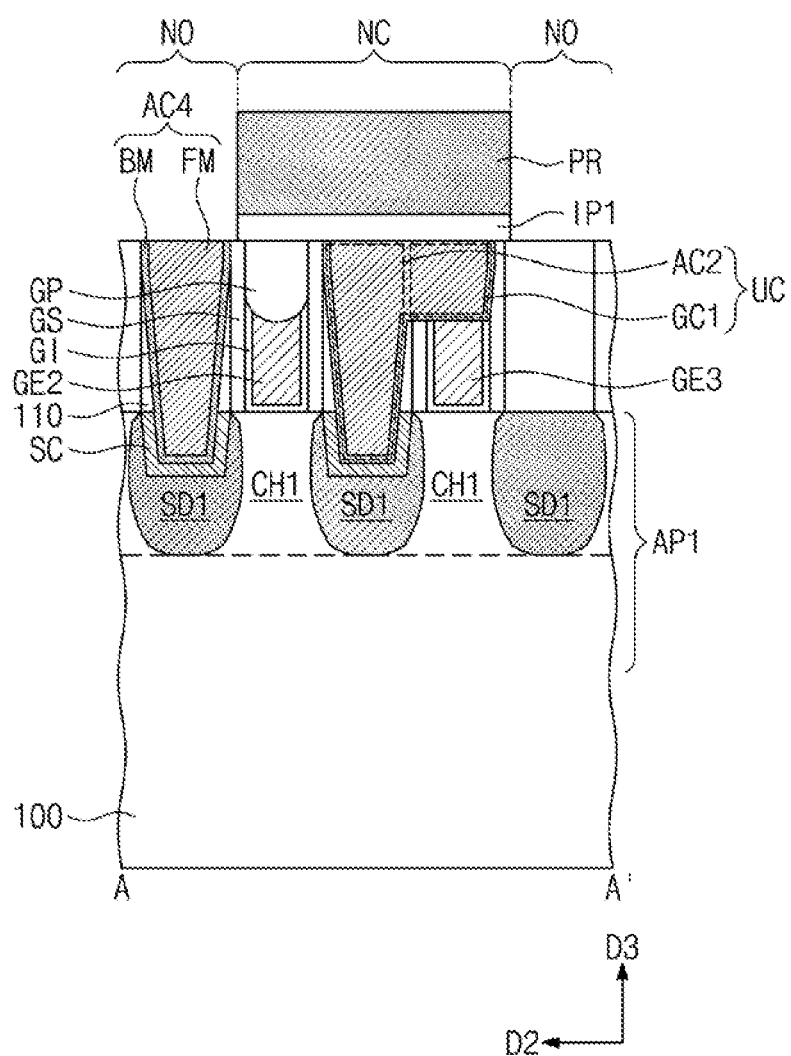
Figure 12B:
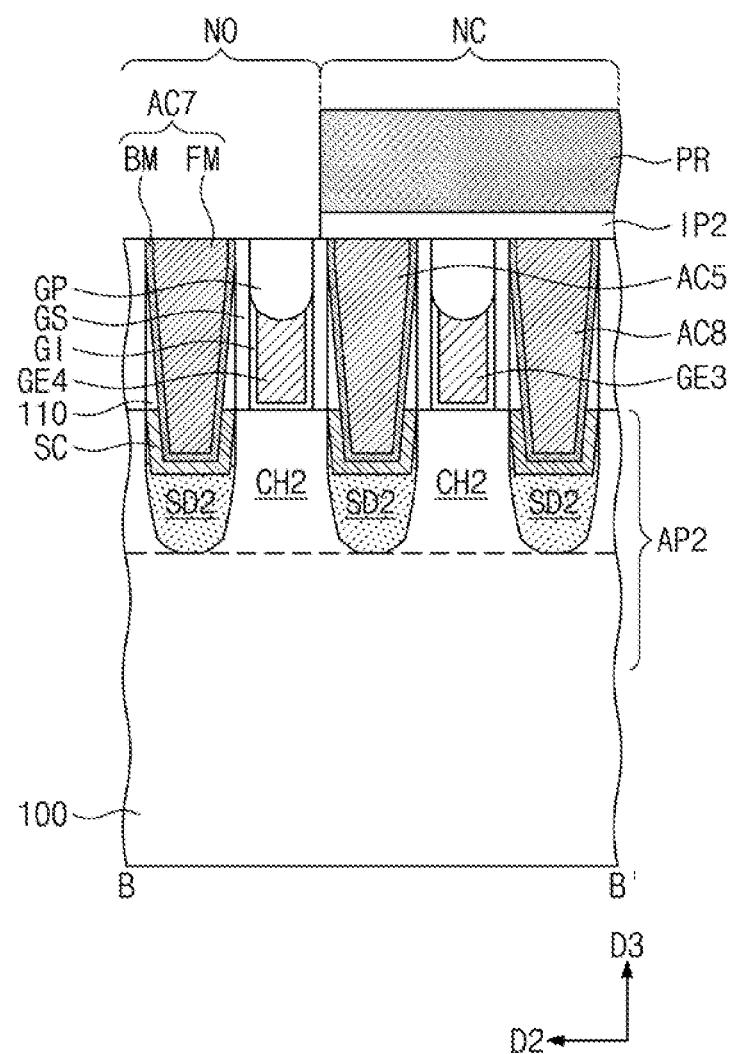
Figure 12C:
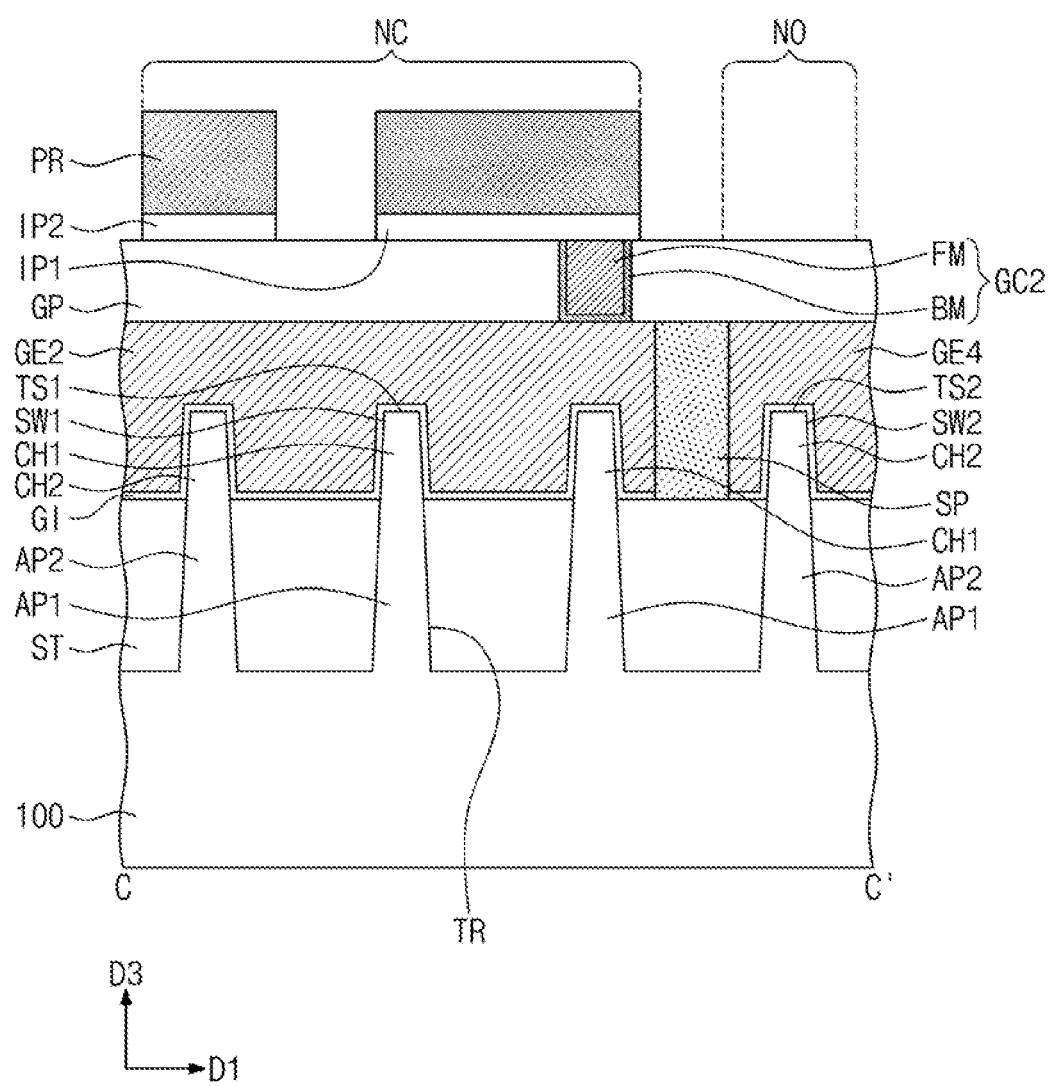
Figure 12D:
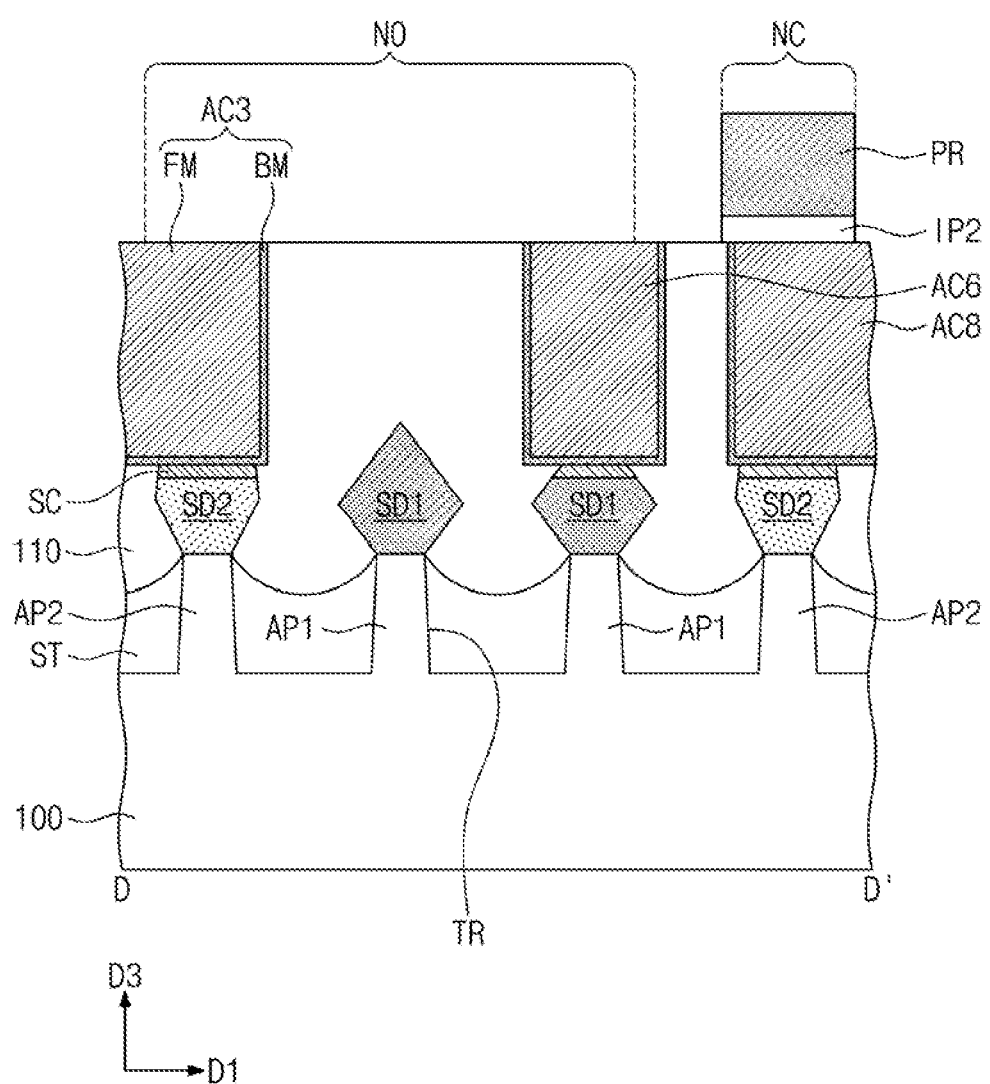

FIGS. 5, 7, 9, and 11 are plan views illustrating a method of fabricating a semiconductor device, according to an example embodiment. FIGS. 6A, 8A, 10A, and 12A are sectional views taken along lines A-A' of FIGS. 5, 7, 9, and 11, respectively. FIGS. 6B, 8B, 10B, and 12B are sectional views taken along lines B-B' of FIGS. 5, 7, 9, and 11, respectively. FIGS. 8C, 10C, and 12C are sectional views taken along lines C-C' of FIGS. 7, 9, and 11, respectively. FIGS. 8D, 10D, and 12D are sectional views taken along lines D-D' of FIGS. 7, 9, and 11, respectively.

Figure 5:
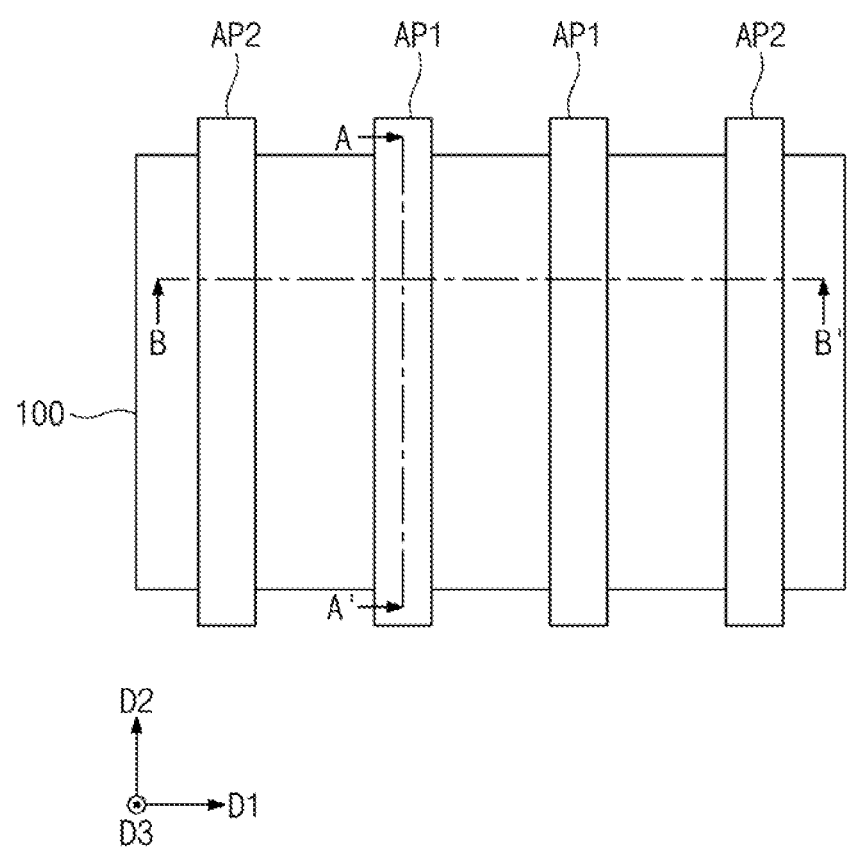
FIGS. 5, 7, 9, and 11 are plan views illustrating a method of fabricating a semiconductor device, according to an example embodiment.
Figure 6A:
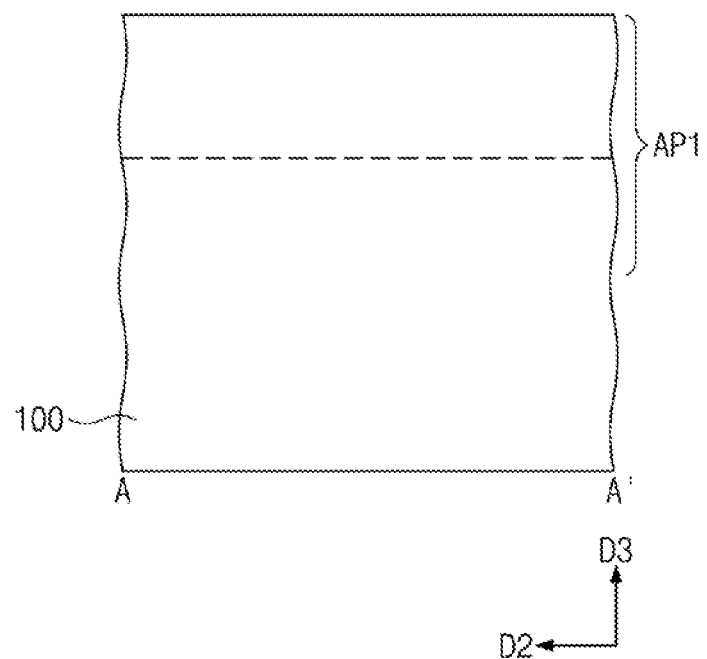
FIGS. 6A, 8A, 10A, and 12A are sectional views taken along lines A-A' of FIGS. 5, 7, 9, and 11, respectively.
Figure 6B:
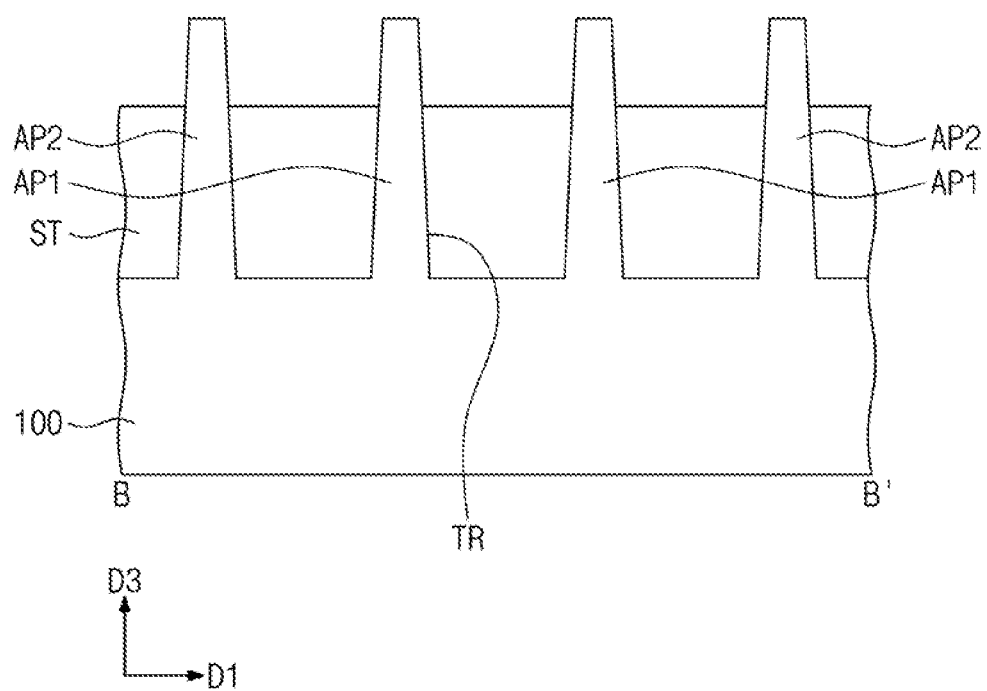
FIGS. 6B, 8B, 10B, and 12B are sectional views taken along lines B-B' of FIGS. 5, 7, 9, and 11, respectively.
Figure 7:
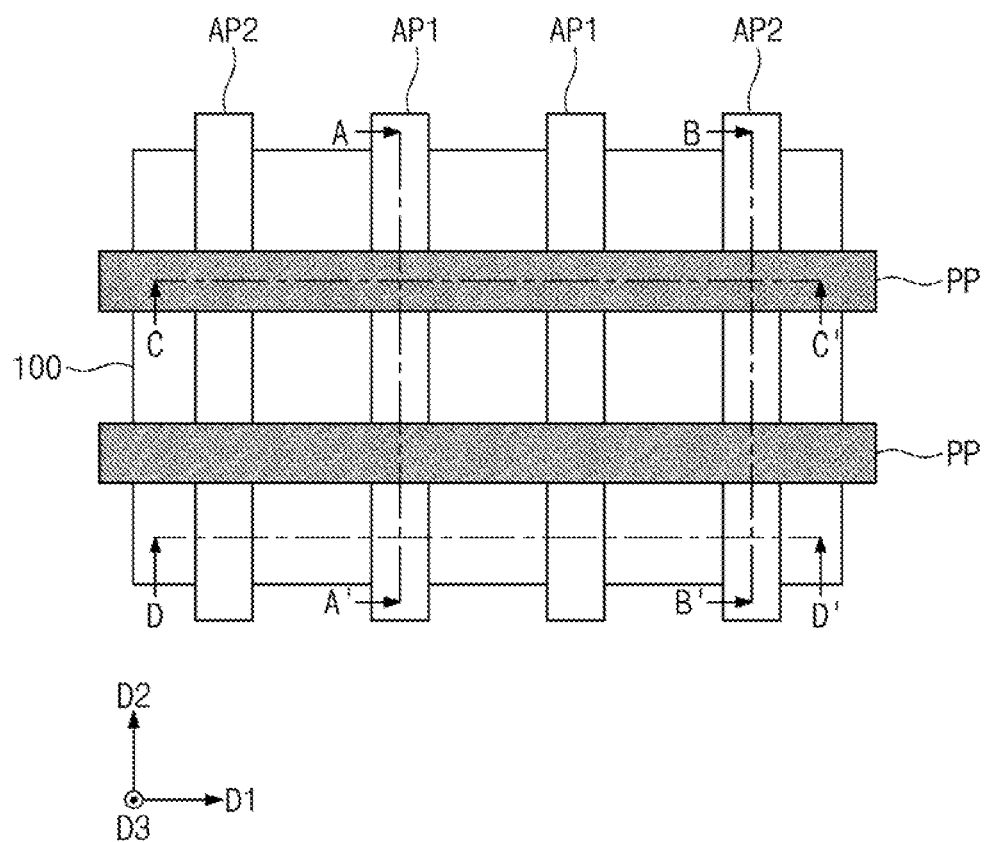

Referring to FIGS. 5, 6A, and 6B, the substrate 100 with the memory cell region MEC may be provided. The substrate 100 may be patterned to form the trenches TR defining the first and second active patterns AP1 and AP2. Thus, the trenches TR may be formed between the first and second active patterns AP1 and AP2. The first and second active patterns AP1 and AP2 may be formed on the memory cell region MEC.

The device isolation layer ST may be formed on the substrate 100 to fill the trenches TR. The device isolation layer ST may be formed of or include an insulating material (e.g., silicon oxide). The device isolation layer ST may be recessed to expose upper portions of the first and second active patterns AP1 and AP2. Accordingly, the upper portions of the first and second active patterns AP1 and AP2 may protrude vertically above the device isolation layer ST.

Referring to FIGS. 7 and 8A to 8D, sacrificial patterns PP may be formed to cross the first and second active patterns AP1 and AP2. The sacrificial patterns PP may be line-shaped patterns extending in the first direction D1. For example, the formation of the sacrificial patterns PP may include forming a sacrificial layer on the substrate 100, forming hard mask patterns MA on the sacrificial layer, and patterning the sacrificial layer using the hard mask patterns MA as an etch mask. The sacrificial layer may be formed of or include polysilicon.

A pair of gate spacers GS may be formed on opposite side surfaces of each of the sacrificial patterns PP. The formation of the gate spacers GS may include conformally forming a gate spacer layer on the substrate 100 and anisotropically etching the gate spacer layer. The gate spacer layer may be formed of or include at least one of SiCN, SiCON, or SiN. In an example embodiment, the gate spacer layer may be a multi-layered structure that is made of at least two of SiCN, SiCON, or SiN.

The first source/drain patterns SD1 may be formed in the upper portion of the first active pattern AP1. The pair of first source/drain patterns SD1 may be formed at both sides of each of the sacrificial patterns PP. For example, first recess regions RS1 may be formed by etching the upper portion of the first active pattern AP1 using the hard mask patterns MA and the gate spacers GS as an etch mask. The device isolation layer ST between the first active patterns AP1 may be partially recessed during the etching of the upper portion of the first active pattern AP1 (e.g., see FIG. 8D).

The first source/drain pattern SD1 may be formed by a selective epitaxial growth process in which an inner side surface of the first recess region RS1 of the first active pattern AP1 is used as a seed layer. As a result of the formation of the first source/drain patterns SD1, the first channel pattern CH1 may be defined between the pair of first source/drain patterns SD1. In an example embodiment, the selective epitaxial growth process may include a chemical vapor deposition (CVD) process or a molecular beam epitaxy (MBE) process. The first source/drain patterns SD1 may be formed of or include a semiconductor material (e.g., SiGe) whose lattice constant is larger than that of the substrate 100. Each of the first source/drain patterns SD1 may be a multi-layered structure including a plurality of semiconductor layers.

In an example embodiment, the first source/drain patterns SD1 may be doped in situ during the selective epitaxial growth process. In another example embodiment, an ion implantation process may be performed to inject impurities into the first source/drain patterns SD1, after the formation of the first source/drain patterns SD1. The first source/drain patterns SD1 may be doped to have a first conductivity type (e.g., p-type).

The second source/drain patterns SD2 may be formed in the upper portion of the second active pattern AP2. The pair of second source/drain patterns SD2 may be formed at both sides of each of the sacrificial patterns PP. For example, second recess regions RS2 may be formed by etching the upper portion of the second active pattern AP2 using the hard mask patterns MA and the gate spacers GS as an etch mask (e.g., see FIG. 8D).

The second source/drain pattern SD2 may be formed by a selective epitaxial growth process, in which an inner side surface of the second recess region RS2 of the second active pattern AP2 is used as a seed layer. As a result of the formation of the second source/drain patterns SD2, the second channel pattern CH2 may be defined between the pair of second source/drain patterns SD2. In an example embodiment, the second source/drain patterns SD2 may be formed of or include the same semiconductor material (e.g., Si) as the substrate 100. The second source/drain patterns SD2 may be doped to have a second conductivity type (e.g., n-type).

The first source/drain patterns SD1 and the second source/drain patterns SD2 may be sequentially formed by different processes. Thus, the first source/drain patterns SD1 and the second source/drain patterns SD2 may not be formed at the same time.

Referring to FIGS. 9 and 10A to FIG. 10D, the first interlayer insulating layer 110 may be formed to cover the first and second source/drain patterns SD1 and SD2, the hard mask patterns MA, and the gate spacers GS, e.g., at the sides of the gate spacers GS. In an example embodiment, the first interlayer insulating layer 110 may be formed of or include silicon oxide.

The first interlayer insulating layer 110 may be planarized to expose top surfaces of the sacrificial patterns PP. The planarization of the first interlayer insulating layer 110 may be performed using an etch-back or chemical mechanical polishing (CMP) process. The planarization process may be performed to completely remove the hard mask patterns MA. Thus, the first interlayer insulating layer 110 may have a top surface that is coplanar with the top surfaces of the sacrificial patterns PP and the top surfaces of the gate spacers GS.

The sacrificial patterns PP may be replaced with the first to fourth gate electrodes GE1 to GE4. For example, the exposed sacrificial patterns PP may be selectively removed, such that empty spaces may be formed as a result of the removal of the sacrificial patterns PP. The gate dielectric pattern GI, the gate electrode GE1 to GE4, and the gate capping pattern GP may be formed in the empty space, from which the sacrificial pattern PP is removed.

The formation of the gate electrode GE1 to GE4 and the gate capping pattern GP may include forming a gate metal layer in the empty space, recessing the gate metal layer, forming a gate capping layer on the recessed gate metal layer, and planarizing the gate capping layer to expose the top surface of the first interlayer insulating layer 110.

The insulating pattern SP may be formed by removing a portion of the gate electrode GE1 to GE4 and filling the removed portion with an insulating material. The gate electrode GE1 to GE4 may be divided into the first to fourth gate electrodes GE1 to GE4 by the insulating pattern SP.

The first to eighth active contacts AC1 to AC8 may be formed to penetrate the first interlayer insulating layer 110 and to be electrically connected to the first and second source/drain patterns SD1 and SD2. The first and second gate contacts GC1 and GC2 may be formed to penetrate the first interlayer insulating layer 110 and the gate capping pattern GP and to be electrically connected to the second and third gate electrodes GE2 and GE3, respectively.

The active contacts AC1 to AC8 and the gate contacts GC1 and GC2 may be formed concurrently by a middle-of-line (MOL) process. For example, first contact holes may be formed in the first interlayer insulating layer 110 by a first photolithography process. The first contact holes may be formed to define the active contacts AC1 to AC8. The first contact holes may be formed to expose the first and second source/drain patterns SD1 and SD2. The first contact holes may be formed in a self-aligned manner using the gate spacers GS and the gate capping patterns GP as a mask.

Second contact holes may be formed by a second photolithography process. The second contact holes may be formed to define the gate contacts GC1 and GC2. The second contact holes may be formed to expose the top surfaces of the second and third gate electrodes GE2 and GE3.

For example, a portion of the first contact hole defining the second active contact AC2 may be overlapped with a portion of the second contact hole defining the first gate contact GC1. In this case, the first and second contact holes, which are overlapped with each other, may form a single contact hole.

The active contacts AC1 to AC8 and the gate contacts GC1 and GC2 may be formed by filling the first and second contact holes with a barrier layer and a conductive layer sequentially. In an example embodiment, the second active contact AC2 and the first gate contact GC1 may be formed as a single contact structure UC. The silicide patterns SC may be formed on the first and second source/drain patterns SD1 and SD2 exposed through the first contact holes.

Referring to FIGS. 11 and 12A to 12D, the first and second insulating structures IP1 and IP2 may be formed on the node close region NC. For example, an insulating layer may be formed on the first interlayer insulating layer 110, e.g., so as to cover the first interlayer insulating layer 110. A photoresist pattern PR defining the node close region NC may be formed on the insulating layer, and the first and second insulating structures IP1 and IP2 may be formed by patterning the insulating layer using the photoresist pattern PR as an etch mask.

The node open region NO may be defined by a region on which the first and second insulating structures IP1 and IP2 are not provided. The top surface of the first interlayer insulating layer 110 of the node open region NO and the top surface of the gate capping pattern GP of the node open region NO may not be covered with the first and second insulating structures IP1 and IP2, and may be exposed to the outside.

Referring back to FIGS. 2 and 3A to 3D, the second interlayer insulating layer 120 may be formed on the first interlayer insulating layer 110. The second interlayer insulating layer 120 may cover the first and second insulating structures IP1 and IP2.

The first interconnection layer M1 may be formed in the second interlayer insulating layer 120 through a back-end-of-line (BEOL) process. The formation of the first interconnection layer M1 may include forming the first bit line BL1, the second bit line BL2, and the power line VDD extending in the second direction D2 and parallel to each other.

Each of the first bit line BL1, the second bit line BL2, and the power line VDD may be formed by a single damascene process. For example, the second interlayer insulating layer 120 may be patterned to form interconnection holes, which are extended in the second direction D2 and parallel to each other. The interconnection hole on the node open region NO may be formed to expose the top surfaces of the contacts AC1 to AC8, GC1, and GC2. The interconnection hole on the node close region NC may be formed to expose the first and second insulating structures IP1 and IP2. The interconnection lines BL1, BL2, and VDD of the first interconnection layer M1 may be formed by filling the interconnection hole with a barrier layer and a conductive layer sequentially. The barrier layer filling the interconnection hole may directly cover the top surfaces of the contacts AC1 to AC8, GC1, and GC2, which are exposed in the node open region NO.

In a general BEOL process, the first interconnection layer M1 may be formed through a dual damascene process of forming a via plug and an interconnection line at the same time. By contrast, according to an example embodiment, since the first interconnection layer M1 includes only the interconnection line, without any via plug, the first interconnection layer M1 may be formed by performing a single damascene process just one time. Accordingly, it may be possible to simplify the fabrication process and to reduce occurrence of the process failure.

Figure 13A:
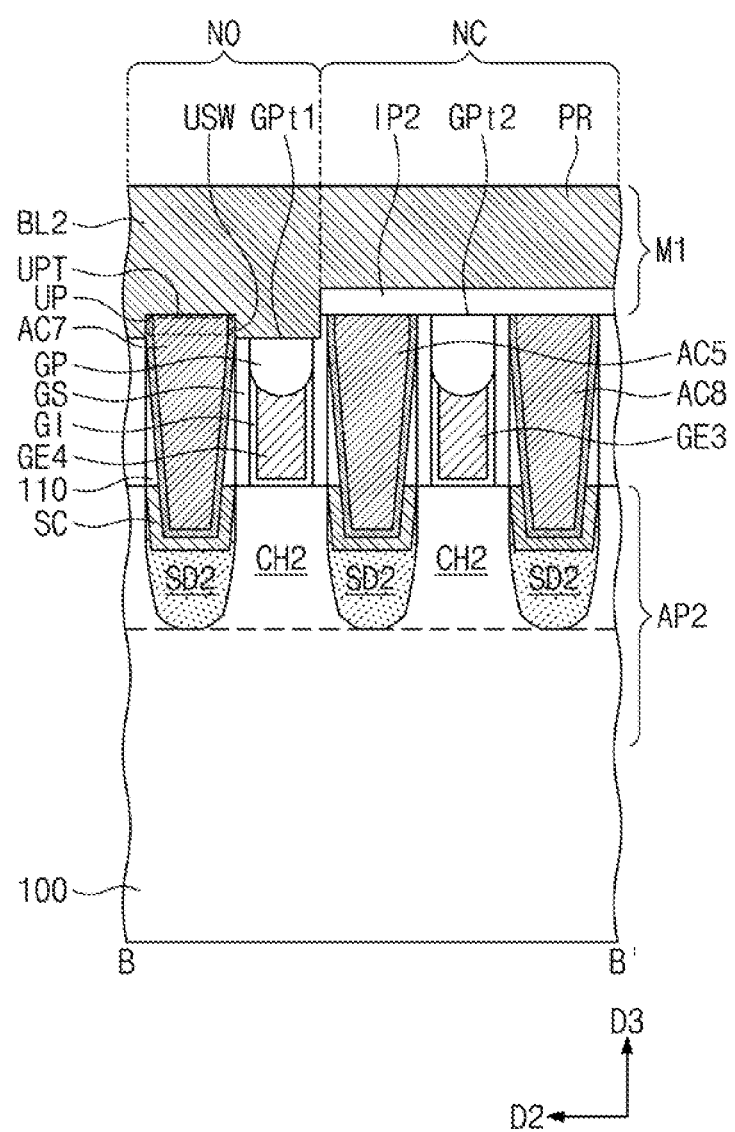
FIGS. 13A, 13B, and 13C are sectional views are taken along lines B-B', C-C', and D-D', respectively, of FIG. 2 to illustrate a semiconductor memory device according to an example embodiment.
Figure 13B:
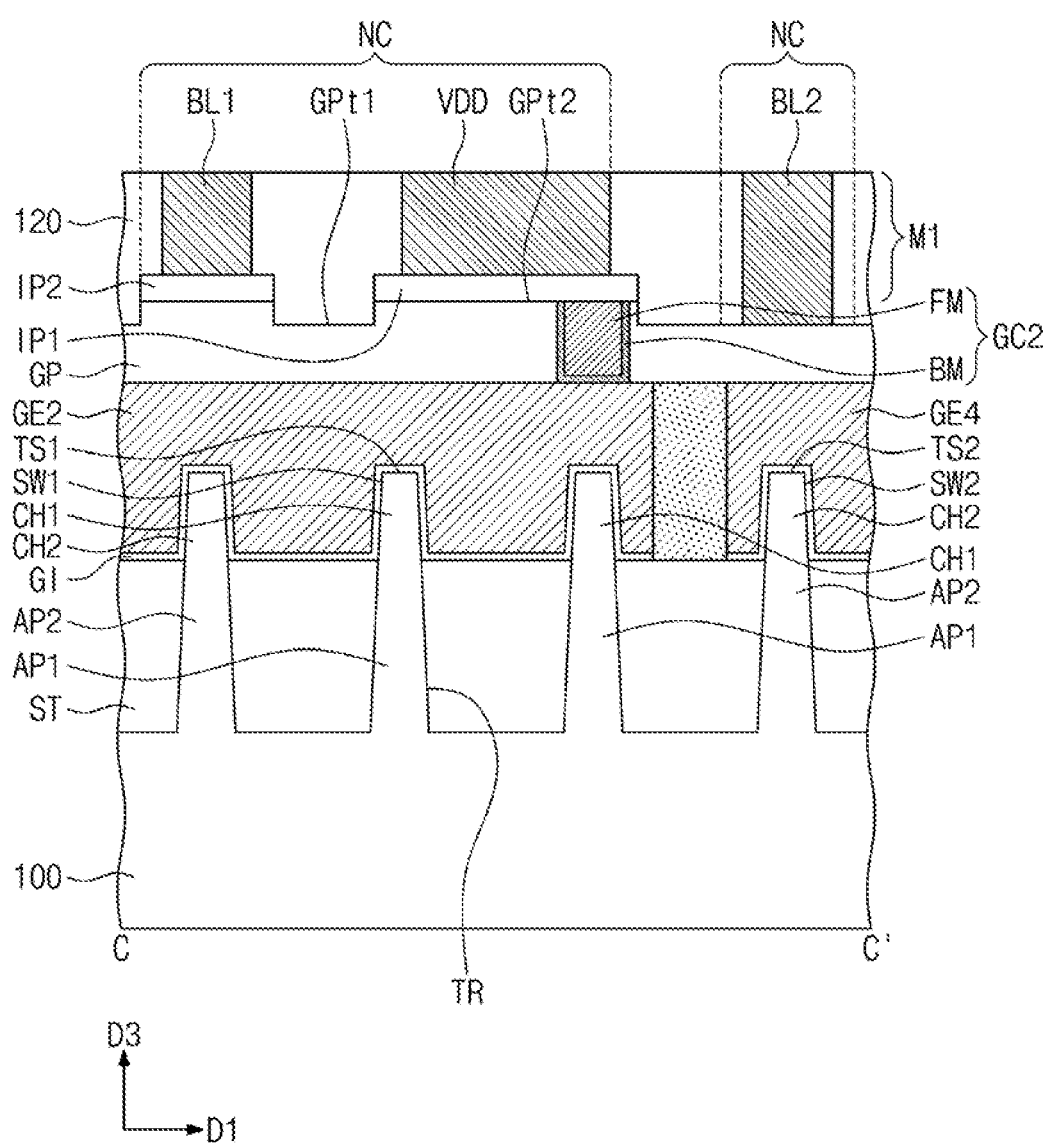
Figure 13C:
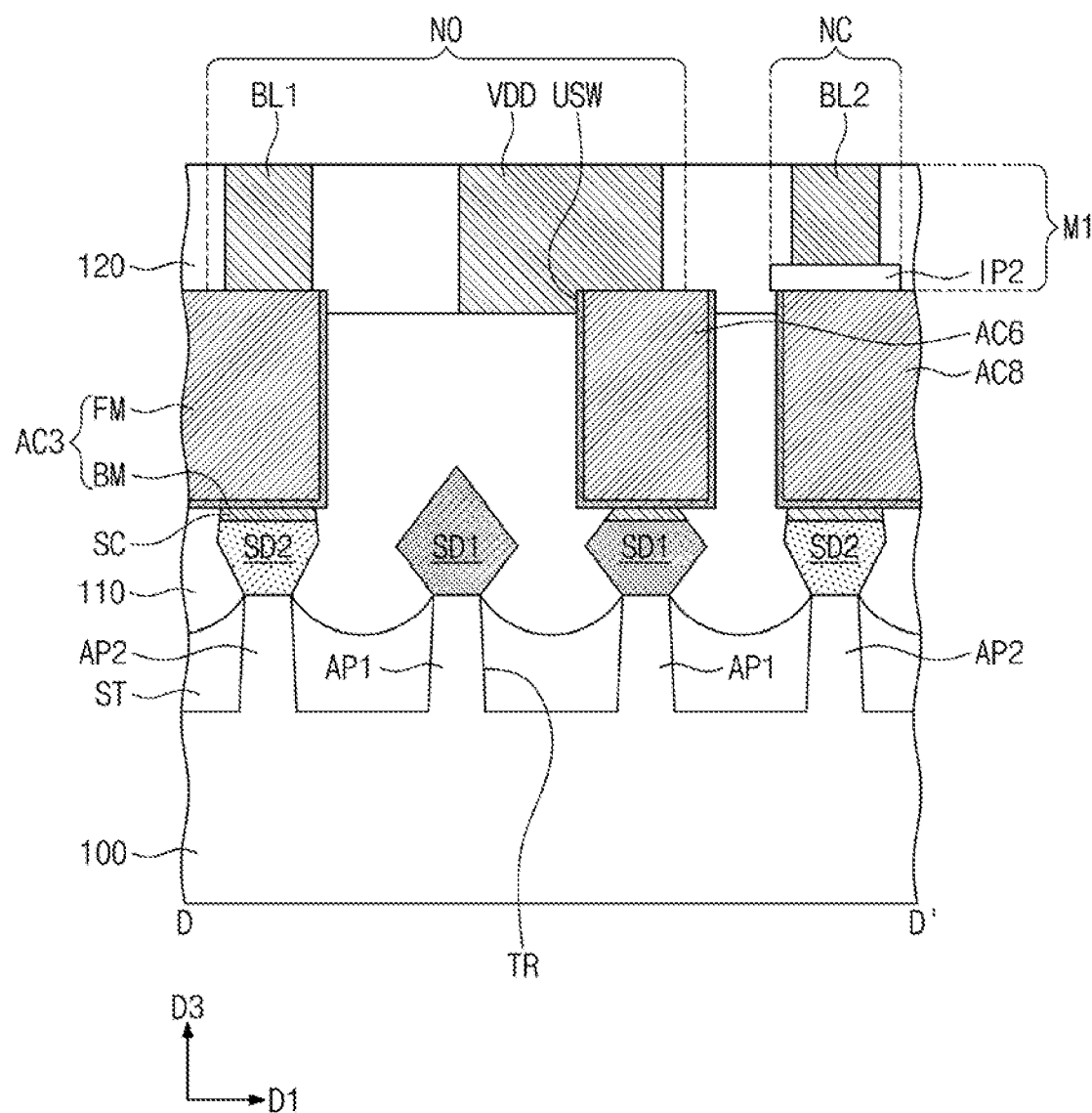

FIGS. 13A, 13B, and 13C are sectional views, which are taken along lines B-B', C-C' and D-D', respectively, of FIG. 2 to illustrate a semiconductor memory device according to an example embodiment. For concise description, an element previously described with reference to FIGS. 1 to 4 may be identified by the same reference number without repeating an overlapping description thereof, and features different from that of the previous embodiment will be described in more detail below.

Referring to FIGS. 2, 13A, 13B, and 13C, a level of the top surface of the first interlayer insulating layer 110 of the node open region NO may be lower than a level of the top surface of the first interlayer insulating layer 110 of the node close region NC. The level of the top surface of the gate capping pattern GP of the node open region NO may be lower than the level of the top surface of the gate capping pattern GP of the node close region NC. Thus, a portion of the first interlayer insulating layer 110 covered with the insulating structures IP1 and IP2 may have a top surface that is higher than another portion that is not covered with the insulating structures IP1 and IP2. A portion of the gate capping pattern GP covered with the insulating structures IP1 and IP2 may have a top surface that is higher than another portion that is not covered with the insulating structures IP1 and IP2.

For example, in the node open region NO, the top surfaces of the contacts AC1 to AC8, GC1, and GC2 may be higher than the top surface of the gate capping pattern GP and the top surface of the first interlayer insulating layer 110. For example, referring to FIG. 13A, the top surface of the seventh active contact AC7 may be higher than a top surface GPt1 of the gate capping pattern GP on the fourth gate electrode GE4. The seventh active contact AC7 may include an upper portion protruding above the gate capping pattern GP and the first interlayer insulating layer 110. Not only the top surface of the seventh active contact AC7 but also an upper side surface USW of the seventh active contact AC7 may be exposed. The second bit line BL2 may cover the top surface and the upper side surface USW of the seventh active contact AC7.

Referring to FIGS. 13A and 13B, the top surface GPt1 of the gate capping pattern GP that is not covered with the insulating structures IP1 and IP2 may be lower than a top surface GPt2 of the gate capping pattern GP that is covered with the insulating structures IP1 and IP2.

Referring to FIG. 13C, the sixth active contact AC6 may include an upper portion protruding above the first interlayer insulating layer 110. The power line VDD may cover the top surface and the upper side surface USW of the sixth active contact AC6.

A method of fabricating a semiconductor device according to the present embodiment will be described in more detail below.

Referring back to FIGS. 11 and 12A to 12D, the first and second insulating structures IP1 and IP2 may be formed by etching an insulating layer using the photoresist pattern PR as an etch mask. The first interlayer insulating layer 110 and the gate capping pattern GP exposed by the photoresist pattern PR may be over-etched during the etching process. Accordingly, the top surfaces of the first interlayer insulating layer 110 and the gate capping pattern GP exposed by the photoresist pattern PR may be lowered.

According to the present embodiment, an interconnection line of the first interconnection layer M1 may be provided to be in contact with top and side surfaces of a protruding upper portion of a contact. Thus, the interconnection line may be in contact with the protruding upper portion of the contact in a three-dimensional manner. Thus, a contact area between the interconnection line and the contact may be increased, and this may make it possible to reduce connection resistance between the interconnection line and the contact. Accordingly, according to an example embodiment, it may be possible to improve electric characteristics of a semiconductor device.

In a semiconductor device according to an example embodiment, an interconnection line of a first interconnection layer may be directly connected to a contact thereunder, and thus, it may be possible to reduce a connection resistance therebetween. Furthermore, it is possible to omit a via plug between the interconnection line and the contact, and thus, it may be possible to prevent a process failure (e.g., a contact failure caused by misalignment). By disposing an insulating structure, it may be possible to easily control the connection or disconnection between the interconnection line and the contact. Accordingly, it may be possible to improve electrical and reliability characteristics of the semiconductor device.

As described above, embodiments relate to a semiconductor device including a field effect transistor and a method of fabricating the same. Embodiments may provide a semiconductor device that includes field effect transistors with improved electrical and reliability characteristics, and a method of fabricating the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a first active pattern on a substrate;
   a first gate electrode crossing the first active pattern;
   a pair of source/drain patterns provided in an upper portion of the first active pattern and at opposite sides, respectively, of the first gate electrode;
   a first gate capping pattern on the first gate electrode;
   an interlayer insulating layer on the pair of source/drain patterns;
   first and second active contacts that penetrate the interlayer insulating layer and are respectively connected to the pair of source/drain patterns; and
   a first interconnection layer on the first and second active contacts,
   wherein the first interconnection layer includes:
      a first insulating structure covering a top surface of the second active contact; and
      a first interconnection line covering a top surface of the first active contact and extending on the first insulating structure, and covering a top surface of the first gate capping pattern between the first and second active contacts, and
   wherein the first interconnection line further covers side and top surfaces of the first insulating structure.

2. The semiconductor device as claimed in claim 1, wherein a ratio of a height of the first interconnection line on the first insulating structure to a height of the first interconnection line on the first active contact ranges from 0.7 to 0.9.

3. The semiconductor device as claimed in claim 1, wherein the first interconnection line is spaced apart from the second active contact by the first insulating structure.

4. The semiconductor device as claimed in claim 1, wherein:
the first interconnection layer includes:
a node open region defining connection with the first and second active contacts; and
a node close region defining disconnection from the first and second active contacts, and
the first insulating structure is disposed in the node close region.

5. The semiconductor device as claimed in claim 1, wherein the first interconnection line is extended in a predetermined direction to further cover a top surface of the interlayer insulating layer.

6. The semiconductor device as claimed in claim 1, wherein:
the first interconnection line includes a conductive pattern and a barrier pattern enclosing the conductive pattern, and
the barrier pattern directly covers the top surface of the first active contact and the top surface of the first gate capping pattern.

7. The semiconductor device as claimed in claim 1, wherein the first insulating structure includes a plurality of stacked insulating layers.

8. The semiconductor device as claimed in claim 1, further comprising:
a second active pattern on the substrate;
a second gate electrode crossing the second active pattern;
a gate spacer at a side of the second gate electrode; and
a second gate capping pattern on the second gate electrode, wherein:
a width of the second gate electrode is larger than a width of the first gate electrode,
a topmost end of the second gate electrode is interposed between the second gate capping pattern and the gate spacer, and
the first interconnection layer further includes a second insulating structure covering the second gate capping pattern and the topmost end of the second gate electrode.

9. The semiconductor device as claimed in claim 1, wherein:
the first interconnection layer further includes a second interconnection line, which is provided adjacent to the first interconnection line and is extended parallel to the first interconnection line, and
a ratio of a height of the first interconnection line on the first insulating structure to a height of the second interconnection line ranges from 0.7 to 0.9.

10. A semiconductor device, comprising:
an active pattern on a substrate;
a first gate electrode crossing the active pattern;
a pair of source/drain patterns provided in an upper portion of the active pattern and at opposite sides, respectively, of the first gate electrode;
a first gate capping pattern on the first gate electrode;
an interlayer insulating layer on the pair of source/drain patterns;
first and second active contacts that penetrate the interlayer insulating layer and are respectively connected to the pair of source/drain patterns, an upper portion of the first active contact protruding above a top surface of the first gate capping pattern; and
a first interconnection layer on the first and second active contacts, the first interconnection layer including:
an insulating structure covering a top surface of the second active contact; and
an interconnection line covering a top surface of the first active contact and extending on the insulating structure, and covering a side surface of the upper portion of the first active contact.

11. The semiconductor device as claimed in claim 10, further comprising:
a second gate electrode crossing the active pattern; and
a second gate capping pattern on the second gate electrode, wherein:
the insulating structure covers a top surface of the second gate capping pattern, and
the top surface of the second gate capping pattern is higher than the top surface of the first gate capping pattern.

12. The semiconductor device as claimed in claim 10, wherein the interconnection line further covers the top surface of the first gate capping pattern between the first and second active contacts.

13. The semiconductor device as claimed in claim 10, wherein a ratio of a height of the interconnection line on the insulating structure to a height of the interconnection line on the first active contact ranges from 0.7 to 0.9.

14. The semiconductor device as claimed in claim 10, wherein a top surface of the interlayer insulating layer, which is not covered with the insulating structure, is lower than the top surfaces of the first and second active contacts.

15. A method of fabricating a semiconductor device, comprising:
patterning a substrate to form an active pattern;
forming a gate electrode that crosses the active pattern;
forming a pair of source/drain patterns in an upper portion of the active pattern, the pair of source/drain patterns being formed at opposite sides, respectively, of the gate electrode;
forming a gate capping pattern on the gate electrode;
forming a first interlayer insulating layer on the pair of source/drain patterns;
forming first and second active contacts that penetrate the first interlayer insulating layer and connect to the pair of source/drain patterns, respectively;
forming an insulating structure that covers a top surface of the second active contact; and
forming an interconnection line on the first active contact, the gate capping pattern, and the insulating structure, the interconnection line being in contact with a top surface of the first active contact and a top surface of the gate capping pattern, and covering side and top surfaces of the insulating structure.

16. The method as claimed in claim 15, wherein the forming of the insulating structure includes:
forming an insulating layer on the first interlayer insulating layer and covering the first and second active contacts;
forming a photoresist pattern on the insulating layer to define a node close region; and
etching the insulating layer using the photoresist pattern as an etch mask.

17. The method as claimed in claim 16, wherein the etching of the insulating layer is performed to etch the gate capping pattern and the first interlayer insulating layer, which are exposed by the photoresist pattern, thereby lowering top surfaces thereof.

18. The method as claimed in claim 15, wherein the interconnection line is formed by a single damascene process including:
- forming a second interlayer insulating layer on the first interlayer insulating layer and the insulating structure;
- patterning the second interlayer insulating layer to form an interconnection hole; and
- sequentially forming a barrier layer and a conductive layer in the interconnection hole.

19. The method as claimed in claim 18, wherein the interconnection hole is formed to expose the top surface of the first active contact and the top surface of the gate capping pattern, which are not covered with the insulating structure.

* * * * *